(12) United States Patent
Kim et al.

(10) Patent No.: US 10,109,629 B2
(45) Date of Patent: Oct. 23, 2018

(54) SEMICONDUCTOR DEVICES INCLUDING GATE STRUCTURES WITH OXYGEN CAPTURING FILMS

(71) Applicant: Samsung Electronics Co., Ltd., Suwon-si, Gyeonggi-do (KR)

(72) Inventors: Ju-youn Kim, Suwon-si (KR); Hyun-jo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 15/355,726

(22) Filed: Nov. 18, 2016

(65) Prior Publication Data

US 2017/0148792 A1  May 25, 2017

(30) Foreign Application Priority Data

Nov. 20, 2015 (KR) .................. 10-2015-0163350

(51) Int. Cl.
*H01L 29/423* (2006.01)
*H01L 29/06* (2006.01)
*H01L 29/78* (2006.01)
*H01L 27/092* (2006.01)
*H01L 29/51* (2006.01)
*H01L 21/8238* (2006.01)
*H01L 21/8234* (2006.01)

(52) U.S. Cl.
CPC .... *H01L 27/092* (2013.01); *H01L 21/823842* (2013.01); *H01L 29/0649* (2013.01); *H01L 29/4236* (2013.01); *H01L 29/512* (2013.01); *H01L 29/7827* (2013.01); *H01L 21/82345* (2013.01)

(58) Field of Classification Search
CPC .............. H01L 27/092; H01L 29/0649; H01L 29/4236; H01L 29/512; H01L 29/7827
USPC .................................................. 257/369, 330
See application file for complete search history.

(56) References Cited

U.S. PATENT DOCUMENTS

| | | |
|---|---|---|
| 7,838,908 B2 | 11/2010 | Kwon et al. |
| 7,863,126 B2 | 1/2011 | Park et al. |
| 7,964,489 B2 | 6/2011 | Koyama et al. |
| 8,120,117 B2 | 2/2012 | Tsuchiya |
| 8,362,573 B2 | 1/2013 | Wu et al. |
| 8,415,677 B2 | 4/2013 | Adusumilli et al. |
| 8,778,789 B2 | 7/2014 | Besser et al. |
| 8,829,617 B2 | 9/2014 | Haran et al. |
| 8,912,607 B2 | 12/2014 | Kwon et al. |
| 8,928,057 B2 | 1/2015 | Cote et al. |

(Continued)

FOREIGN PATENT DOCUMENTS

| | | |
|---|---|---|
| JP | 2011-023738 | 2/2011 |
| KR | 1020110056120 | 9/2016 |

*Primary Examiner* — Cuong Q Nguyen
*Assistant Examiner* — Tong-Ho Kim
(74) *Attorney, Agent, or Firm* — Ward and Smith, P.A.

(57) ABSTRACT

A semiconductor device includes: a semiconductor substrate including an active region and a gate structure on the active region. The gate structure includes a gate insulating film; a work function adjusting film on the first gate insulating film; a separation film on the work function adjusting film; and an oxygen capturing film on the separation film and configured to capture oxygen introduced from the outside of the first gate structure. The oxygen capturing film is spaced apart from a top surface of the first gate insulating film by about 70 Å to about 80 Å.

15 Claims, 24 Drawing Sheets

(56) References Cited

U.S. PATENT DOCUMENTS

| | | |
|---|---|---|
| 9,502,416 B1 * | 11/2016 | Kim; Ju-Youn .... H01L 27/1116 |
| 2009/0134466 A1 | 5/2009 | Cho et al. |
| 2010/0327364 A1 | 12/2010 | Tsuchiya |
| 2011/0227163 A1 | 9/2011 | Wang et al. |
| 2011/0260258 A1 | 10/2011 | Zhu et al. |
| 2012/0018810 A1 * | 1/2012 | Chambers ......... H01L 21/28088 |
| | | 257/369 |
| 2012/0032332 A1 | 2/2012 | Lim et al. |
| 2013/0026579 A1 | 1/2013 | Lu et al. |
| 2013/0193522 A1 | 8/2013 | Kwon et al. |
| 2013/0214364 A1 | 8/2013 | Jagannathan et al. |
| 2014/0001543 A1 * | 1/2014 | Kim .................. H01L 29/66636 |
| | | 257/330 |
| 2014/0120711 A1 | 5/2014 | Tsai et al. |
| 2014/0154877 A1 | 6/2014 | Besser et al. |
| 2014/0203335 A1 | 7/2014 | Song et al. |
| 2014/0239407 A1 | 8/2014 | Manabe et al. |
| 2014/0306273 A1 | 10/2014 | Ho et al. |
| 2015/0041905 A1 | 2/2015 | Xie et al. |
| 2015/0041913 A1 | 2/2015 | An et al. |
| 2015/0061027 A1 | 3/2015 | Hong et al. |
| 2015/0129962 A1 | 5/2015 | Xie et al. |
| 2016/0133472 A1 * | 5/2016 | Kim .................. H01L 21/28088 |
| | | 438/283 |

* cited by examiner

FIG. 3B

| APPLIED VOLTAGE | EMBODIMENT 1 | COMPARATIVE EXAMPLE |
|---|---|---|
| V1 | 0.206 | 0.211 |
| V2 | 0.189 | 0.187 |
| V3 | 0.183 | 0.180 |

FIG. 3C

| APPLIED VOLTAGE | EMBODIMENT 2 | EMBODIMENT 3 |
|---|---|---|
| V1 | 0.232 | 0.230 |
| V2 | 0.210 | 0.207 |
| V3 | 0.195 | 0.189 |

SEMICONDUCTOR DEVICES INCLUDING GATE STRUCTURES WITH OXYGEN CAPTURING FILMS

CROSS-REFERENCE TO RELATED APPLICATION

This application claims the benefit of Korean Patent Application No. 10-2015-0163350, filed on Nov. 20, 2015, in the Korean Intellectual Property Office, the disclosure of which is incorporated herein by reference in its entirety.

BACKGROUND

The inventive concepts relate to semiconductor devices, and more particularly, to semiconductor devices including a gate structure in which properties of a work function adjusting film are improved.

As semiconductor devices become more and more miniaturized, the performance of the devices may be affected by even small variations in the device structure or in manufacturing process used to produce the devices. In particular, variations in the gate electrode structure can greatly affect the reliable operation of transistors.

SUMMARY

The inventive concepts provide a semiconductor device that may impede or prevent a work function of a gate structure from being changed as impurities are introduced into a gate structure of a transistor.

According to an aspect of the inventive concepts, there is provided a semiconductor device including a semiconductor substrate including an active region, and a gate structure extending to cross the active region, wherein the gate structure includes a gate insulating film, a work function adjusting film on the gate insulating film, a separation film on the work function adjusting film, an oxygen capturing film on the separation film and configured to capture oxygen introduced from the outside of the gate structure, wherein the oxygen capturing film is spaced apart by about 70 Å to about 80 Å from a top surface of the gate insulating film.

The semiconductor device may further include an interlayer insulating film on the semiconductor substrate and including a gate hole that defines the gate structure, wherein the semiconductor device includes a adhesive film on the oxygen capturing film, and a gap-fill film on the adhesive film and configured to fill a remaining space of the gate hole in which the gate insulating film, the work function adjusting film, the separation film, the oxygen capturing film, and the adhesive film are formed.

The work function adjusting film may be by sequentially stacking a TiN film and a TiAlC film, the separation film may include a TiN film, the oxygen capturing film may include a TiAlC film, the adhesive film may include a TiN film, and the gap-fill film may include tungsten (W) or aluminum (Al).

The semiconductor device may further include a second gate structure extending to cross the active region, wherein the interlayer insulating film further includes a second gate hole to define the second gate structure, wherein the second gate structure includes a second gate insulating film, a second work function adjusting film on the second gate insulating film, a second adhesive film directly contacting a top surface of the second work function adjusting film, and a second gap-fill film directly contacting a top surface of the second adhesive film and configured to fill a remaining space of the second gate hole in which the second gate insulating film, the second work function adjusting film, and the second adhesive film are formed.

An oxygen concentration in the work function adjusting film may be less than an oxygen concentration in the second work function adjusting film.

The gate structure may be a gate structure of an n-type transistor and the second gate structure may be a gate structure of a p-type transistor.

The semiconductor device may further include a gap-fill film on the oxygen capturing film, wherein a resistivity of a material of the oxygen capturing film is higher than a resistivity of a material of the gap-fill film.

A thickness of the oxygen capturing film may be less than a thickness of the work function adjusting film.

The oxygen capturing film may include a metal material and a non-metal material, wherein a ratio of the metal material in the oxygen capturing film may increase with distance from an interface between the oxygen capturing film and the separation film.

According to another aspect of the inventive concepts, there is provided a semiconductor device including a semiconductor substrate including an active region, a gate structure extending to cross the active region, and an interlayer insulating film on the semiconductor substrate and including a gate hole to define the gate structure, wherein the gate structure includes a gate insulating film, a work function adjusting film directly contacting a top surface of the gate insulating film, a separation film directly contacting a top surface of the work function adjusting film, an oxygen capturing film directly contacting a top surface of the separation film and configured to capture oxygen introduced from the outside of the gate structure, and a adhesive film directly contacting a top surface of the oxygen capturing film.

The semiconductor device may further include a second gate structure extending to cross the active region, wherein the interlayer insulating film further includes a second gate hole to define the second gate structure, wherein the second gate structure includes a second gate insulating film, a second work function adjusting film directly contacting a top surface of the second gate insulating film, and a second adhesive film directly contacting a top surface of the second work function adjusting film, wherein the gate structure is an n-type gate structure and the second gate structure is a p-type gate structure.

The gate structure may further include a gap-fill film directly contacting a top surface of the adhesive film and configured to fill a remaining space of the gate hole in which the gate insulating film, the work function adjusting film, the separation film, the oxygen capturing film, and the adhesive film are formed, and the second gate structure further includes a second gap-fill film directly contacting a top surface of the second adhesive film and configured to fill a remaining space of the second gate hole in which the second gate insulating film, the second work function adjusting film, and the second adhesive film are formed.

An oxygen concentration in the work function adjusting film may be less than an oxygen concentration in the second work function adjusting film.

The oxygen capturing film may be substantially spaced apart by about 70 Å to about 80 Å from the top surface of the gate insulating film.

The work function adjusting film may be by sequentially stacking a TiN film and a TiAlC film, the separation film may include a TiN film, the oxygen capturing film may include a TiAlC film, the adhesive film may include a TiN film, and the gap-fill film may include a tungsten (W) film or an aluminum (Al) film.

A semiconductor device according further embodiments includes an active region and a gate structure on the active region. The gate structure includes a gate insulating film, a work function adjusting film in direct contact with the gate insulating film, a separation film on the work function adjusting film, and an oxygen capturing film on the separation film. The oxygen capturing film includes a metal material having a high reactivity with oxygen, and the oxygen capturing film does not substantially affect a threshold voltage of the gate structure.

BRIEF DESCRIPTION OF THE DRAWINGS

Embodiments of the inventive concept will be more clearly understood from the following detailed description taken in conjunction with the accompanying drawings in which:

FIG. 3B is a table showing a threshold voltage of a gate structure according to whether an oxygen capturing film is included;

FIG. 3C is a table showing a threshold voltage of a gate structure according to a thickness of an oxygen capturing film;

DETAILED DESCRIPTION OF THE EMBODIMENTS

Figure 1:
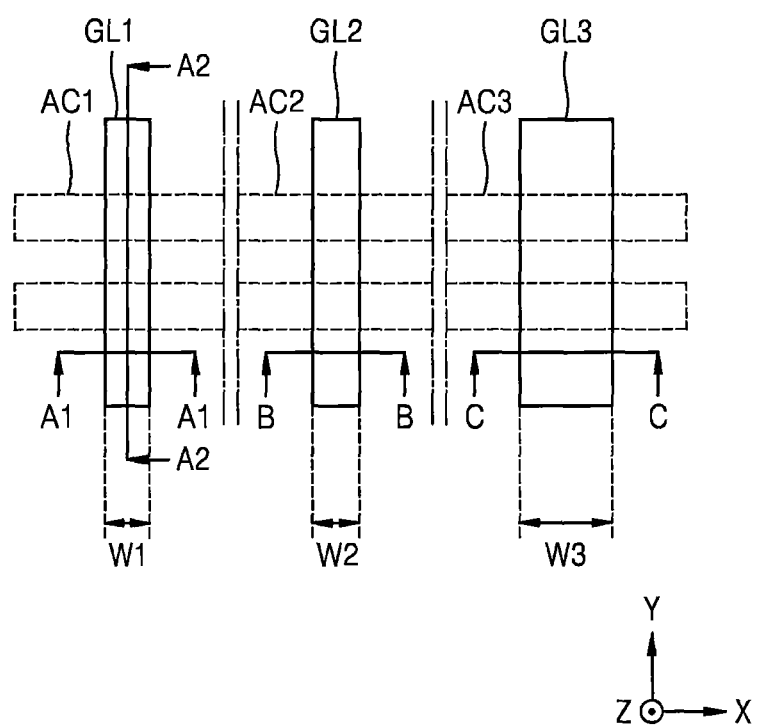
FIG. 1 is a schematic layout of a semiconductor device according to embodiments.

The invention may, however, be embodied in many different forms and should not be construed as being limited to the embodiments set forth herein. For example, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. When a certain embodiment may be implemented differently, a specific process order may be different from the described order. For example, two consecutively described processes may be performed substantially at the same time or performed in an order opposite to the described order.

The terms used in the present specification are merely used to describe embodiments, and are not intended to limit the inventive concept. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the same elements are denoted by the same reference numerals and a repeated explanation thereof will be briefly given. Various elements and regions in the drawings are schematic in nature and their shapes or intervals are not intended to limit the scope of the inventive concept.

As used herein, the term "and/or" includes any and all combinations of one or more of the associated listed items. Expressions such as "at least one of" when preceding a list of elements, modify the entire list of elements and do not modify the individual elements of the list.

FIG. 1 is a schematic layout of a semiconductor device 10 according to some embodiments of the inventive concepts.

Referring to FIG. 1, the semiconductor device 10 may include a first active region AC1 with a fin shape extending in one direction, for example, an X-direction, and a first gate structure GL1 extending in a second direction, for example, a Y-direction, that is different from the direction in which the first active region AC1 extends such that the gate structure GL1 crosses the first active region AC1.

The semiconductor device 10 may include a plurality of gate structures. That is, the semiconductor device 10 may include a second active region AC2 with a fin shape extending in one direction, for example, the X-direction, and a second gate structure GL2 extending in a direction, for example, the Y-direction, different from the direction in which the second active region AC2 extends to cross the second active region AC2. In some embodiments, the first gate structure GL1 may be an n-type gate structure and the second gate structure GL2 may a p-type gate structure. However, some embodiments of the inventive concepts are not limited thereto. That is, the first gate structure GL1 may be a p-type gate structure and the second gate structure GL2 may be an n-type gate structure. Alternatively, both the first and second gate structures GL1 and GL2 may be n-type gate structures or p-type gate structures. A width W1 of a short side of the first gate structure GL1 and a width W2 of a short side of the second gate structure GL2 may be substantially the same. However, some embodiments of the inventive concepts are not limited thereto.

The semiconductor device 10 may include a plurality of gate structures having different shapes. That is, the semiconductor device 10 may include a third active region AC3 with a fin shape extending in one direction, for example, the X-direction, and a third gate structure GL3 extending in a second direction, for example, the Y-direction, that is different from the direction in which the third active region AC3 extends and having a width W3 that is different from those of the first and second gate structures GL1 and GL2. For example, the width W3 of a short side of the third gate structure GL3 may be greater than the width W1 of the short side of the first gate structure GL1. The third gate structure GL3 may be formed to cross the third active region AC3.

In this case, the first and second gate structures GL1 and GL2 may constitute a transistor of a cell region densely formed according to a design rule. The third gate structure GL3 may constitute a transistor in a logic region or a peripheral region, and may be larger than the transistors in the cell region. However, regions where the first through third gate structures GL1, GL2, and GL3 are formed are not limited thereto. For example, the first and second gate structures GL1 and GL2 may be formed to constitute transistors in a logic region or a peripheral region.

Although the first through third active regions AC1, AC2, and AC3 extend in the X-direction and the first through third gate structures GL1, GL2, and GL3 extend in the Y-direction, the inventive concepts are not limited thereto. For example, the first through third active regions AC1, AC2, and AC3 may extend in different directions, and the first through third gate structures GL1, GL2, and GL3 may extend in different directions.

Figure 2A:
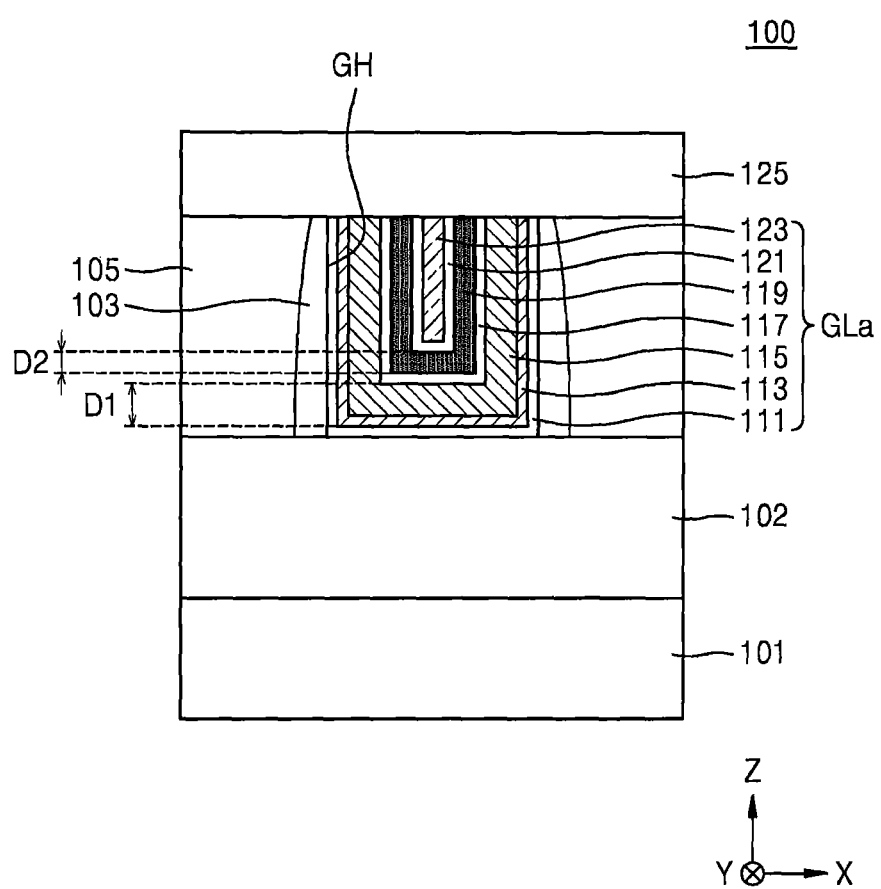
FIGS. 2A and 2B are cross-sectional views of a semiconductor device according to embodiments, respectively taken along line A1-A1 of FIG. 1 and line A2-A2 of FIG. 1.
Figure 2B:
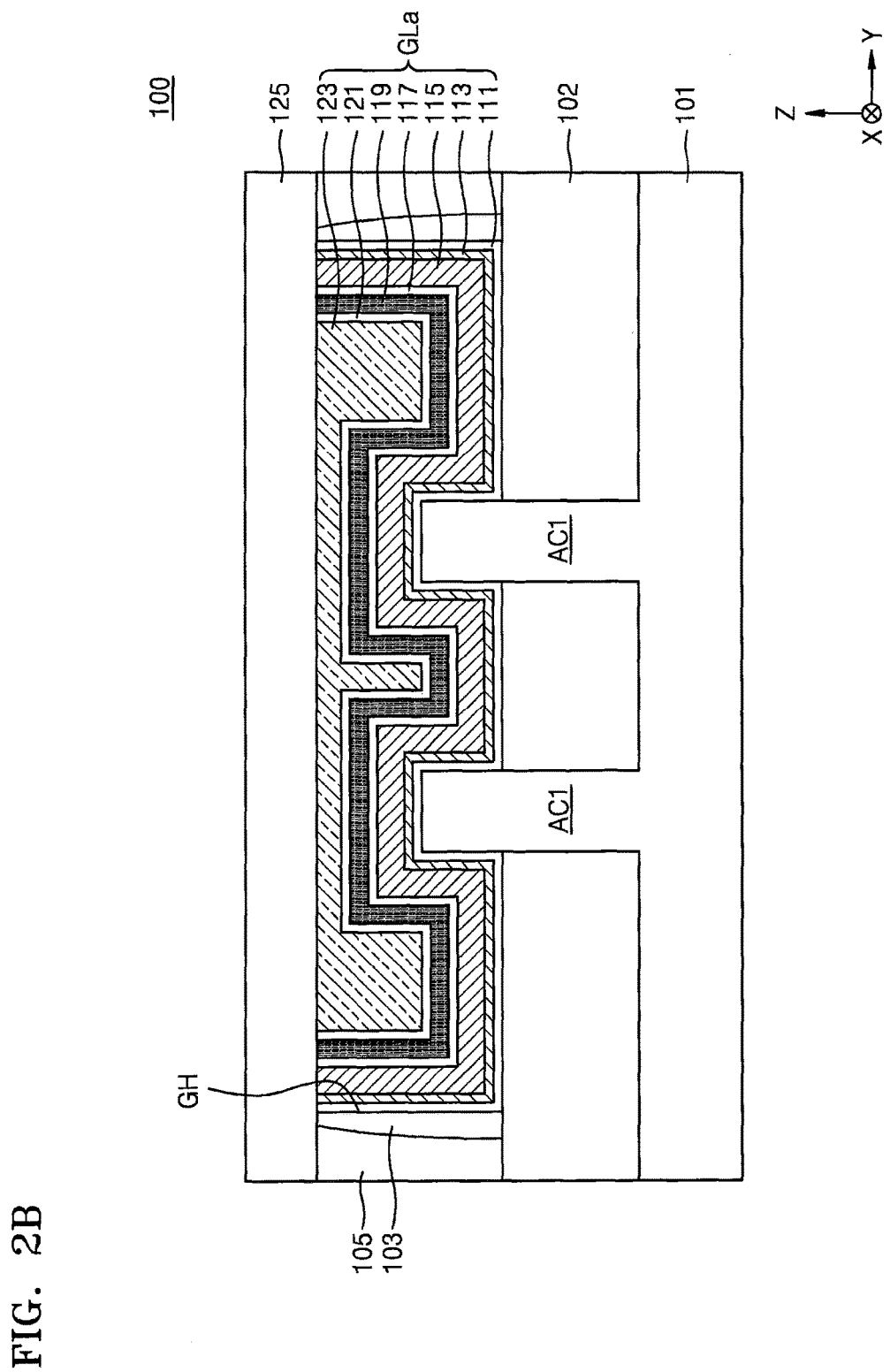

FIGS. 2A and 2B are cross-sectional views of the semiconductor device 10 of FIG. 1. In particular, FIG. 2A is a cross-sectional view taken along line A1-A1 of FIG. 1, and FIG. 2B is a cross-sectional view taken along line A2-A2 of FIG. 1.

Referring to FIGS. 1, 2A, and 2B, the semiconductor device 100 may include a semiconductor substrate 101 extending in a first direction (e.g., an X-direction) and a second direction (e.g., a Y-direction), an active region AC1 with a fin shape protruding in a third direction (e.g., a Z-direction) from the semiconductor substrate 101 and extending in the first direction, and a gate structure GLa extending in the second direction to cross the active region AC1 with the fin shape.

The semiconductor substrate 101 may be formed based on a bulk wafer or a silicon-on-insulator (SOI) wafer. The semiconductor substrate 101 may include a group IV semiconductor, such as silicon (Si) or germanium (Ge), a group IV-IV compound semiconductor such as silicon germanium (SiGe) or silicon carbide (SiC), or a group III-V compound semiconductor such as gallium arsenide (GaAs), indium arsenide (InAs), or indium phosphide (InP). Also, the semiconductor substrate 101 may be based on an epitaxial wafer, a polished wafer, or an annealed wafer.

The semiconductor substrate 101 may be a p-type substrate including p-type impurity ions or may be an n-type substrate including n-type impurity ions. The active region AC1 may include a structure doped with impurities or a well formed by heavily doping impurity ions into the semiconductor substrate 101. For example, the active region AC1 may include source/drain regions formed by doping impurities into the semiconductor substrate 101.

Although the semiconductor device 100 is a fin field-effect transistor including the active region AC with the fin shape, the inventive concept is not limited thereto. In some embodiments, a semiconductor device according to the inventive concept may be a planar field-effect transistor. In this case, the semiconductor substrate 101 may include an active region defined by a device isolation film such as a shallow trench isolation (STI) film. In this case, the gate structure GLa may be formed to cross a top surface of the active region defined by the device isolation film.

A device isolation film 102 may be formed on the semiconductor substrate 101. The device isolation film 102 may fill between the active regions AC1 each having the fin shape and may be formed so that an upper portion of the active region AC1 with the fin shape protrudes beyond the top of the device isolation film 102. The device isolation film 102 may include a silicon oxide film, a silicon nitride film, a silicon oxynitride film, or a combination thereof.

The gate structure GLa may extend to cover a top surface of the device isolation film 102 and both side surfaces and a top surface of the active region AC1 protruding beyond the top of the device isolation film 102. The gate structure GLa may contact the active region AC1 to form a metal-oxide-semiconductor field-effect transistor. A channel may be formed on the both side surfaces and the top surface of the active region AC1 contacting the gate structure GLa.

The gate structure GLa may be formed in a gate hole GH defined by a spacer 103 on the device isolation film 102. The gate structure GLa may be formed by sequentially stacking a gate insulating film 111, work function adjusting films 113 and 115, a separation film 117, an oxygen capturing film 119, an adhesive film 121, and a gap-fill film 123. In this case, each of the gate insulating film 111, the work function adjusting films 113 and 115, the separation film 117, the oxygen capturing film 119, the adhesive film 121, and the gap-fill film 123 may be formed to uniformly cover both side surfaces and a bottom surface of the gate hole GH.

The gate insulating film 111 formed at the bottom surface of the gate hole GH may be formed to cover the top surface of the device isolation film 102 and the both side surfaces and the top surface of the active region AC1 with the fin shape.

The gate insulating film 111 may include a silicon oxide film, a silicon nitride film, a silicon oxynitride film, an oxide/nitride/oxide (ONO) film, a high-k dielectric film with a dielectric constant higher than that of a silicon oxide film, or a combination thereof. For example, the gate insulating film 111 may have a dielectric constant ranging from about 10 to about 25. In detail, the gate insulating film 111 may be formed of a material selected from the group including, but not limited to, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. The gate insulating film 111 may be formed by using any of various deposition methods such as atomic layer deposition (ALD), chemical vapor deposition (CVD), or physical vapor deposition (PVD).

The work function adjusting films 113 and 115 may be formed on the gate insulating film 111. From among the work function adjusting films 113 and 115, the first work function adjusting film 113 may be a lower work function adjusting film and the work function adjusting film 115 may be an upper work function adjusting film.

The first work function adjusting film 113 may protect the gate insulating film 111 in order to prevent the gate insulating film 111 from reacting with the work function adjusting film 115 to change physical properties of the gate insulating films 111. Also, the work function adjusting film 115 may adjust a work function of the gate structure GLa.

The work function adjusting films 113 and 115 may be n-type or p-type work function adjusting films. When the work function adjusting films 113 and 115 are n-type work function adjusting films, the work function adjusting films 113 and 115 may include a material selected from among TiAl, TiAlN, TaC, TiC, HfSi, and a combination thereof. For example, the work function adjusting film 113 may be formed of TiN and the work function adjusting film 115 may be formed of TiAlC. However, the inventive concept is not limited thereto.

Also, when the work function adjusting films 113 and 115 are p-type work function adjusting films, the work function adjusting films 113 and 115 may include a material selected from among Mo, Pd, Ru, Pt, TiN, WN, TaN, Ir, TaC, RuN, MoN, and a combination thereof.

Although the semiconductor device 100 includes two work function adjusting films, that is, the work function adjusting films 113 and 115, the inventive concepts are not limited thereto. In some embodiments, the semiconductor device 100 may include one work function adjusting film, or three or more work function adjusting films.

The separation film 117 may physically separate the work function adjusting films 113 and 115 from the oxygen capturing film 119. The separation film 117 may protect the work function adjusting films 113 and 115 and may prevent the oxygen capturing film 119, the adhesive film 121, and the gap-fill film 123 from affecting the work function adjusting films 113 and 115.

The separation film 117 may include, but is not limited to, TiN. In some embodiments, the separation film 117 may be formed of W, WN, WC, Ti, TiN, Ta, TaN, Ru, Co, Mn, WN, Ni, NiB, or a combination thereof.

The oxygen capturing film 119 may capture oxygen introduced from the outside of the gate structure GLa. Accordingly, the introduced oxygen may be blocked before reaching the work function adjusting films 113 and 115. If the oxygen penetrates into the work function adjusting films 113 and 115, physical properties of the work function adjusting films 113 and 115 may be changed.

In general, if the work function adjusting films 113 and 115 each formed of a metal material react with oxygen, physical properties may be changed so that resistances of the work function adjusting films 113 and 115 are increased. That is, a threshold voltage of the semiconductor device 100 applied by the work function adjusting films 113 and 115 may be increased to be higher than an initially designed value. Accordingly, when a low voltage is applied to the semiconductor device 100 having a high threshold voltage, the semiconductor device 100 including the work function adjusting films 113 and 115 may not operate.

Since the semiconductor device 100 according to the inventive concepts includes an oxygen capturing film 119, the ingress of a foreign material such as oxygen may be reduced or prevented and physical properties of the work function adjusting films 113 and 115 may be maintained. Accordingly, the reliable operation of the semiconductor device 100 may be promoted.

The oxygen capturing film 119 may be formed of a metal material having a high reactivity with oxygen. Accordingly, although the oxygen capturing film 119 may have a higher electrical resistance than the gap-fill film 123, the oxygen capturing film 119 may impede or prevent a threshold voltage applied by the work function adjusting films 113 and 115 from being increased, thereby promoting more reliable operation of the semiconductor device 100.

The oxygen capturing film 119 having a high reactivity with oxygen may be formed of, but is not limited to, TiAlC. In some embodiments, the oxygen capturing film 119 having a high reactivity with oxygen may include TiAl, Al, Ti, TaN, Ta, or a combination thereof.

In some embodiments, the work function adjusting films 113 and 115 and the oxygen capturing film 119 may be formed of the same material. In this case, the separation film 117 may physically separate the work function adjusting films 113 and 115 from the oxygen capturing film 119. In some embodiments, a first thickness D1 of the work function adjusting films 113 and 115 may be greater than a second thickness D2 of the oxygen capturing film 119.

In some embodiments, each of the work function adjusting films 113 and 115, the separation film 117, and the oxygen capturing film 119 may be formed by using ALD, metal organic ALD (MOALD), or metal organic CVD (MOCVD).

The oxygen capturing film 119 is physically separated from the work function adjusting films 113 and 115 by the separation film 117. Also, the oxygen capturing film 119 may be substantially spaced apart by about 70 Å to about 80 Å from a top surface of the gate insulating film 111. The oxygen capturing film 119 is separated from the work function adjusting films 113 and 115 by the separation film 117 and performs a function different from a function of the work function adjusting films 113 and 115 that adjust a work function of the gate structure GLa.

The oxygen capturing film 119 may impede or prevent oxygen from being introduced into the work function adjusting films 113 and 115 and may maintain a work function value of the work function adjusting films 113 and 115 that is previously determined at the design stage. That is, the oxygen capturing film 119 may not affect the work function value that is previously determined by the work function adjusting films 113 and 115. Accordingly, the oxygen capturing film 119 may avoid the introduction of defects during a manufacturing process in order to maintain the work function value that is initially designed by the work function adjusting films 113 and 115.

In general, work function adjusting films are stacked in a gate structure. Since the separation film 117 and the oxygen capturing film 119 stacked on the work function adjusting films 113 and 115 are not elements for adjusting a work function of the gate structure GLa but elements for maintaining a previously designed work function value, the separation film 117 and the oxygen capturing film 119 may be different from films in typical gate structures. Detailed description will be explained below with reference to FIGS. 3B and 3C.

The adhesive film (e.g., a wetting film) 121 may be formed so that the gap-fill film 123 is more easily deposited on the oxygen capturing film 119. Also, the adhesive film 121 may adhere the oxygen capturing film 119 to the gap-fill film 123. The adhesive film 121 may include, but is not limited to, metal nitride such as TiN or TaN or a combination thereof.

The gap-fill film 123 may be formed to fill a space remaining after the gate insulating film 111, the work function adjusting films 113 and 115, the separation film 117, the oxygen capturing film 119, and the adhesive film 121 are sequentially stacked in the gate hole GH. The gap-fill film 123 may be formed on the adhesive film 121 to fill a space between the active regions AC1 each with the fin shape.

The gap-fill film 123 may include, but is not limited to, tungsten (W) or a tungsten alloy. In some embodiments, the gap-fill film 123 may include a material having a low resistance, such as a metal carbide, metal nitride, metal silicide, metal aluminum carbide, metal aluminum nitride, metal aluminum, metal silicon nitride, or a combination thereof. Also, the gap-fill film 123 may be formed of Cu, CuSn, CuMg, CuNi, CuZn, CuPd, CuAu, CuRe, CuW, or a combination thereof. Alternatively, the gap-fill film 123 may include Al, Au, Be, Bi, Co, Cu, Hf, In, Mn, Mo, Ni, Pb, Pd, Pt, Rh, Re, Ru, Ta, Te, Ti, W, Zn, Zr, or a combination thereof.

The gap-fill film 123 may have a single-layer structure or a multi-layer structure. The gap-fill film 123 may be formed using a deposition process, such as ALD, CVD, or PVD, but some embodiments of the inventive concepts are not limited thereto.

A first interlayer insulating film 105 may be formed on the device isolation film 102 and the active region AC1 with the fin shape that is exposed. The first interlayer insulating film 105 may be formed to cover side surfaces of the gate structure GLa and the active region AC1 with the fin shape. A plurality of the active regions AC1 may be insulated from one another by the first interlayer insulating film 105. Top surfaces of the first interlayer insulating film 105 and the gate structure GLa may be at the same level above the substrate.

The first interlayer insulating film 105 may include, but is not limited to, a silicon oxide film, a silicon nitride film, a silicon oxyniride film, or a combination thereof. The spacer 103 and the first interlayer insulating film 105 may be formed of materials having different etch selectivities.

A second interlayer insulating film 125 may be formed to cover the top surfaces of the first interlayer insulating film 105 and the gate structure GLa. The second interlayer insulating film 125 may include, but is not limited to, a silicon oxide film, a silicon nitride film, a silicon oxynitride film, or a combination thereof. In some embodiments, the second interlayer insulating film 125 may be formed of any one film selected from among a tetra ethyl ortho silicate (TEOS) film and an ultra low-K film having an ultra low dielectric constant K such as a SiOC film or a SiCOH film.

Although not shown in FIGS. 2A and 2B, wiring lines may be formed on the second interlayer insulating film 125. Some of the wiring lines may be power wiring lines or ground wiring lines.

Although not shown in FIGS. 2A and 2B, a plurality of conductive contact plugs may be formed on the active region AC1 with the fin shape to pass through the first and second interlayer insulating films 105 and 125. The plurality of conductive contact plugs may be respectively connected to a source region and a drain region of the active region AC1 formed by doping impurities. The source and drain regions may be formed on portions of the active region AC1 with the fin shape located on opposite sides of the gate structure GLa.

Although the gate structure GLa of FIGS. 2A and 2B corresponds to the first gate structure GL1 of FIG. 1, the gate structure GLa may apply to the second gate structure GL2 and the third gate structure GL3 of FIG. 1.

In some embodiments, the work function adjusting film 113 may include a TiN film, the work function adjusting film 115 may include a TiAlC film, the separation film 117 may include a TiN film, the oxygen capturing film 119 may include a TiAlC film, the first adhesive film 121 may include a TiN film, and the gap-fill film 123 may include a W film.

Figure 3A:
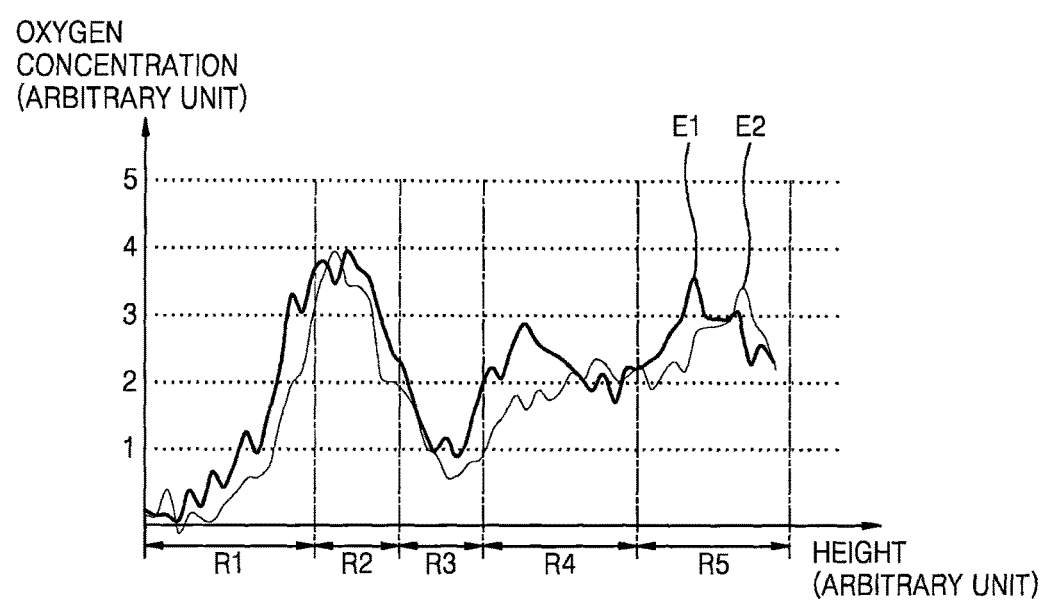
FIG. 3A is a graph showing oxygen concentrations according to a deposition height of a gate structure according to embodiments and a general gate structure.

FIG. 3A is a graph showing first and second oxygen concentrations E1 and E2 by position in the gate structure GLa of the semiconductor device 100 of FIG. 1 and a general gate structure, respectively.

Referring to FIGS. 2A through 3A, a first region R1 through a fifth region R5 correspond to layers constituting the gate structure GLa included in the semiconductor device 100 of FIGS. 2A and 2B. The first region R1 corresponds to the device isolation film 102, the second region R2 corresponds to the gate insulating film 111, the third region R3 corresponds to the work function adjusting film 113 that is a lower work function adjusting film, the fourth region R4 corresponds to the work function adjusting film 115 that is an upper work function adjusting film, and the fifth region R5 corresponds to the separation film 117 and the oxygen capturing film 119 of the semiconductor device 100.

The general gate structure does not include an oxygen capturing film. That is, although the first region R1 corresponds to a device isolation film, the second region R2 corresponds to a gate insulating film, the third region R3 corresponds to a lower work function adjusting film, and the fourth region R4 corresponds to an upper work function adjusting film, and the fifth region R5 corresponds to a general electrode material film instead of the oxygen capturing film 119. The general electrode material film may refer to a film having a low reactivity with oxygen and formed of a material having a lower resistivity than a material of the oxygen capturing film 119 such as TiAlC, TiAl, Al, Ti, TaN, Ta, or a combination thereof.

The first and second oxygen concentrations E1 and E2 in the first region R1 are found to be not completely the same but are similar to each other in each section of the first region R1. The first and second oxygen concentrations E1 and E2 in the second, third, and fifth regions R2, R3, and R5 are also found to be similar.

In contrast, the first and second oxygen concentrations E1 and E2 in the fourth region R4 are found to be very different from each other. That is, the first oxygen concentration E1 (corresponding to the semiconductor device 100 of FIG. 1 with an oxygen capturing film) in the fourth region R4 is found to range from about 3 (in an arbitrary unit) to about 1.5 whereas the second oxygen concentration E2 (corresponding to a gate structure without an oxygen capturing film) in the fourth region R4 is found to range from about 2.5 to about 1 and to be generally less than the first oxygen concentration E1.

The gate structure GLa of the semiconductor device 100 according to the inventive concepts and the general gate structure of a general semiconductor device are different in that the gate structure GLa includes the oxygen capturing film 119. While not wishing to be bound by any particular theory, a difference between the first and second oxygen concentrations E1 and E2 in the fourth region R4 seems to be caused by the oxygen capturing film 119. That is, when the oxygen capturing film 119 is included in the device, oxygen may be effectively impeded or prevented from being introduced into the work function adjusting film 115. Accordingly, physical properties of the work function adjusting films 113 and 115 may be maintained, thereby promoting the reliable operation of the semiconductor device 100.

FIG. 3B is a table showing a threshold voltage of a gate structure according to whether an oxygen capturing film is included in the gate structure. Embodiment 1 indicates a threshold voltage of a gate structure including an oxygen capturing film and comparative example indicates a threshold voltage of a gate structure not including an oxygen capturing film. First through third applied voltages V1, V2, and V3 that are divided according to magnitudes are voltages applied to the gate structures of the embodiment 1 and the comparative example. Members in FIG. 3B may correspond to members of FIGS. 1 through 2B having the same names. In this case, it is assumed that no oxygen is introduced into a work function adjusting film. Accordingly, the gate structure of the comparative example has an initially designed threshold voltage.

Referring to FIG. 3B, the gate structure of the embodiment 1 is formed by sequentially stacking a work function adjusting film, a separation film, an oxygen capturing film, and an adhesive film according to the inventive concept. In this case, the oxygen capturing film is physically separated from the work function adjusting film by the separation film and is substantially spaced apart by about 70 Å to about 80 Å from a top surface of the gate insulating film. Accordingly, the oxygen capturing film is separated from the work function adjusting film and performs a function different from a function of the work function adjusting film that sets a work function of the gate structure.

The gate structure of the comparative example is a general gate structure and is formed by sequentially stacking a work function adjusting film and an adhesive film that have the same materials and thicknesses as those in the embodiment 1. That is, the gate structure of the comparative example does not include the separation film and the oxygen capturing film that are included in the gate structure of the embodiment 1.

When the first applied voltage V1 is applied to the gate structures of the embodiment 1 and the comparative example, a threshold voltage of the embodiment 1 is about 0.206 eV and a threshold voltage of the comparative example is about 0.211 eV that is higher than the threshold voltage of the embodiment 1. That is, a difference between the threshold voltages of the embodiment 1 and the comparative example is just about 0.005 eV, that is, just about 0.02%.

Likewise, when the second applied voltage V2 is applied to the gate structures of the embodiment 1 and the comparative example, a threshold voltage of the embodiment 1 is about 0.189 eV and a threshold voltage of the comparative example is about 0.187 eV that is lower than the threshold voltage of the embodiment 1. That is, a difference between the threshold voltages of the embodiment 1 and the comparative example is just about 0.002 eV, that is, just about 0.01%.

Likewise, when the third applied voltage V3 is applied to the gate structures of the embodiment 1 and the comparative example, a threshold voltage of the embodiment 1 is about 0.183 eV and a threshold voltage of the comparative example is about 0.180 eV that is lower than the threshold voltage of the embodiment 1. That is, a difference between the threshold voltages of the embodiment 1 and the comparative example is just about 0.003 eV, that is, just about 0.02%.

That is, since a threshold voltage is changed by just about 0.05% or less as the separation film and the oxygen capturing film are added, it is found that the gate structures have substantially the same threshold voltage.

In detail, in a gate structure of a general n-type transistor, when a thickness of a work function adjusting film increases, the work function of the gate may decrease and the threshold voltage of the transistor may increase. However, in the embodiment 1, even when the separation film and the oxygen capturing film having predetermined thicknesses are added to the work function adjusting film, a threshold voltage of the embodiment 1 may be substantially similar to or lower than a threshold voltage of the comparative example. That is, it is found that the separation film and the oxygen capturing film perform functions different from a function of an element that adjusts a work function. However, it is found that the comparative example and the embodiment 1 have substantially the same threshold voltage even when the oxygen capturing film is added, on the assumption that oxygen is not introduced into the work function adjusting film. Accordingly, in a common process environment where oxygen can be introduced into a work function adjusting film, a gate structure including an oxygen capturing film may maintain a lower threshold voltage, that is, an initially designed threshold voltage, than a general gate structure having a threshold voltage that is increased due to the introduction of oxygen into the work function adjusting film.

FIG. 3C is a table showing a threshold voltage of a gate structure for embodiments having oxygen capturing films of different thicknesses. First through third applied voltages V1, V2, and V3 that are divided according to magnitudes are voltages applied to gate structures of embodiment 2 and embodiment 3.

Referring to FIG. 3C, each of the gate structures of the embodiment 2 and the embodiment 3 is formed by sequentially stacking a work function adjusting film, a separation film, an oxygen capturing film, and an adhesive film according to the inventive concept. In this case, a thickness of the oxygen capturing film of the embodiment 3 is greater by about 10 Å than a thickness of the oxygen capturing film of the embodiment 2.

When the first applied voltage V1 is applied to the gate structures of the embodiment 2 and 3, a threshold voltage of the embodiment 2 is about 0.232 eV and a threshold voltage of the embodiment 3 is about 0.230 eV. That is, a difference between the threshold voltages of the embodiment 2 and the embodiment 3 is just about 0.002 eV, that is, just about 0.009%.

When the second applied voltage V2 is applied to the gate structures of the embodiment 2 and the embodiment 3, a threshold voltage of the embodiment 2 is about 0.210 eV and a threshold voltage of the embodiment 3 is about 0.207 eV. That is, a difference between the threshold voltages of the embodiment 2 and the embodiment 3 is just about 0.003 eV, that is, just about 0.01%.

When the third applied voltage V3 is applied to the gate structures of the embodiment 2 and the embodiment 3, a threshold voltage of the embodiment 2 is about 0.195 eV and a threshold voltage of the embodiment 3 is about 0.188 eV. That is, a difference between the threshold voltages of the embodiment 2 and the embodiment 3 is just about 0.006 eV, that is, just about 0.03%.

That is, since a threshold voltage is changed by about 0.05% as a thickness of the oxygen capturing film is changed, it is found that the embodiments 2 and 3 maintain substantially the same threshold voltage irrespective of thicknesses of the oxygen capturing films.

In detail, the embodiment 3 (including the oxygen capturing film whose thickness is greater by about 10 Å than that in the embodiment 2) has a threshold voltage that is lower by about 0.002 eV, about 0.003 eV, or about 0.006 eV than that in the embodiment 2.

Considering that in a general gate structure of an n-type transistor, the threshold voltage increases as the thickness of a work function adjusting film increases, it is found that the oxygen capturing film performs a function different from a function of an element that adjusts a work function, since FIG. 3C illustrates that the threshold voltage tends to decrease as the thickness of the oxygen capturing film increases.

Figure 4:
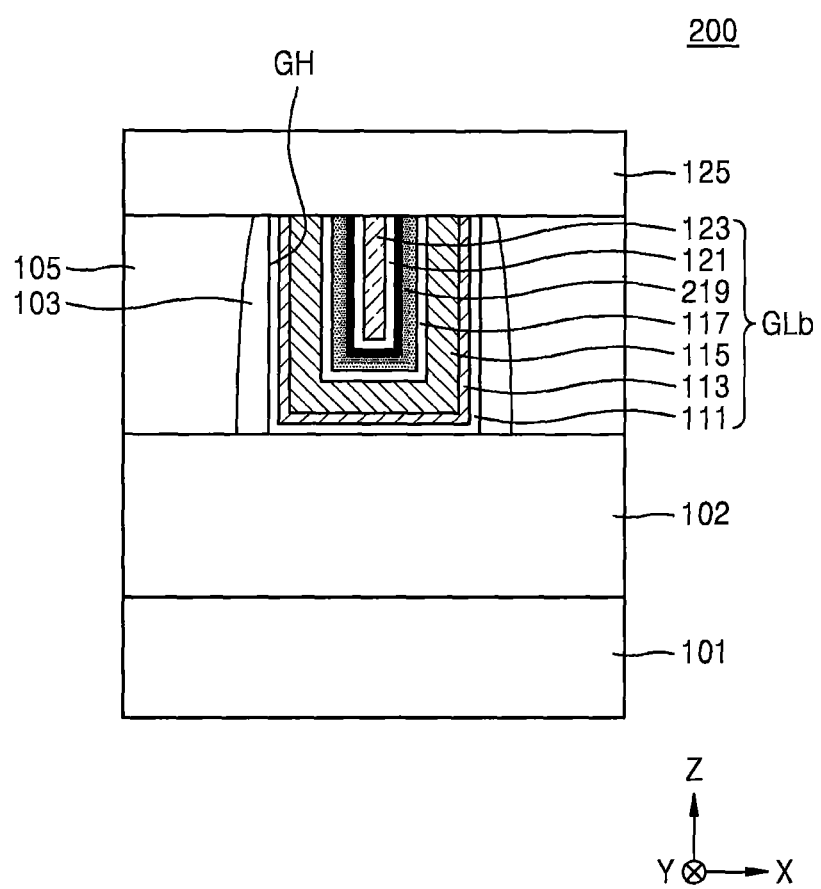
FIGS. 4 through 6 are cross-sectional views of semiconductor devices, taken along line A-A1 of FIG. 1, according to other embodiments.
Figure 5:
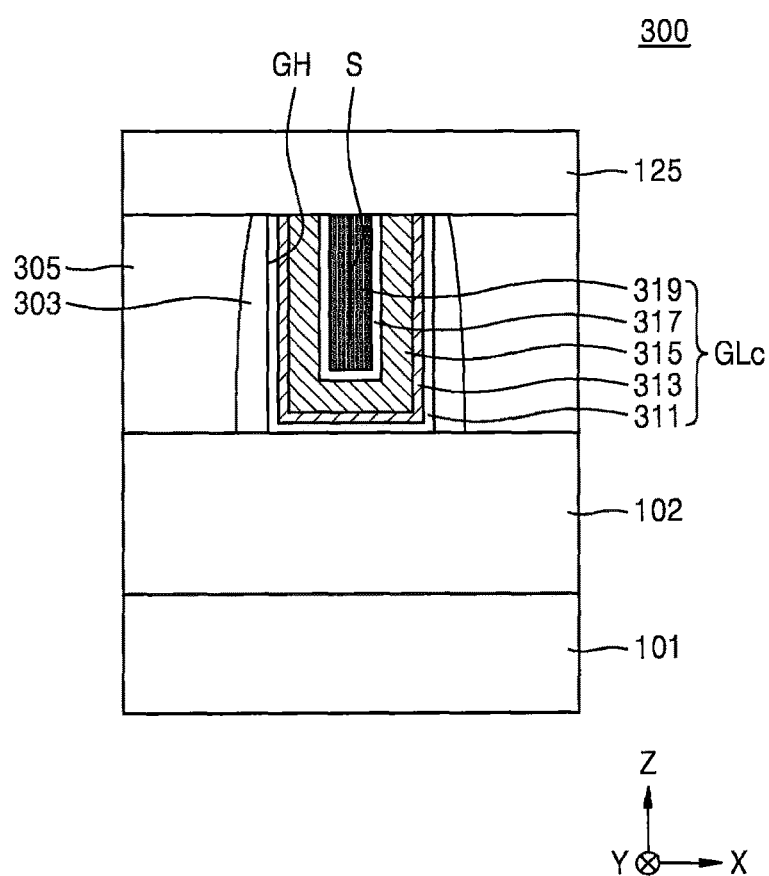
Figure 6:
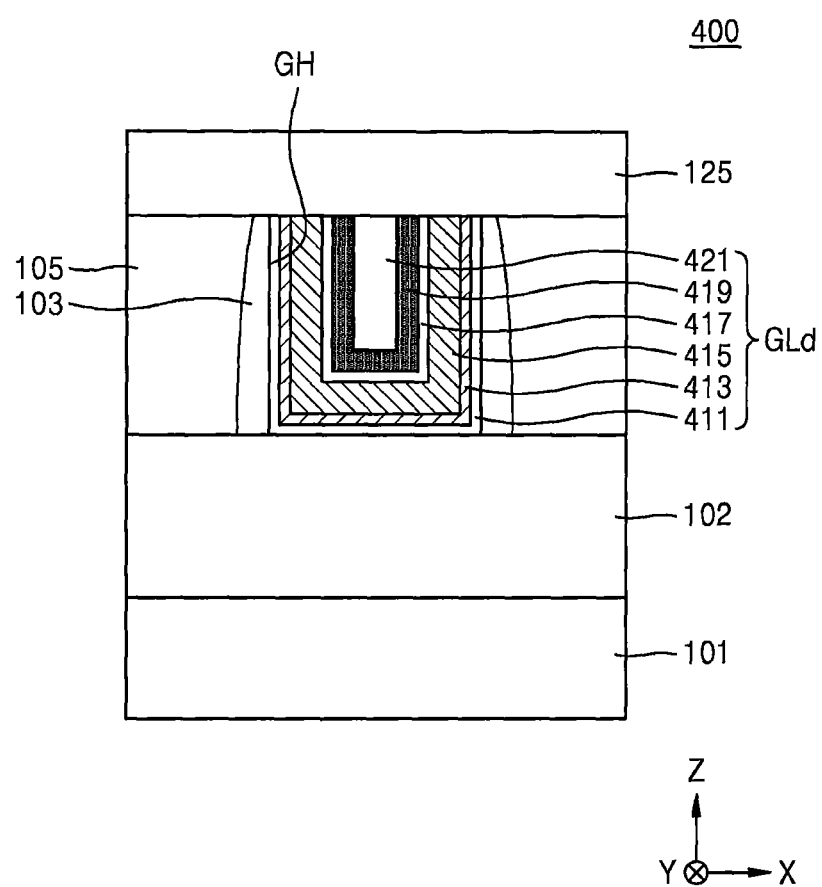

FIGS. 4 through 6 are cross-sectional views of semiconductor devices 200, 300, and 400 according to other embodiments of the inventive concepts. FIGS. 4 through 6 are cross-sectional views taken along line A1-A1 of FIG. 1. The same elements are denoted by the same reference numerals and a repeated explanation thereof will be briefly given.

Referring to FIG. 4, the semiconductor device 200 is similar to the semiconductor device 100 of FIGS. 2A and 2B except for a distribution of materials included in an oxygen capturing film 219 of a gate structure GLb.

The gate structure GLb may be formed in the gate hole GH defined by the spacer 103 on the device isolation film 102. The gate structure GLb may be formed by sequentially stacking the gate insulating film 111, the work function adjusting films 113 and 115, the separation film 117, the oxygen capturing film 219, the adhesive film 121, and the gap-fill film 123. In this case, each of the gate insulating film 111, the work function adjusting films 113 and 115, the separation film 117, the oxygen capturing film 219, the adhesive film 121, and the gap-fill film 123 may be formed to uniformly cover both side surfaces and a bottom surface of the gate hole GH.

The oxygen capturing film 219 may include a plurality of materials, and may have a distribution in which a ratio of the plurality of materials varies according to a deposition height.

In some embodiments, when the oxygen capturing film 219 includes a metal material and a non-metal material, the oxygen capturing film 219 may have a distribution in which a ratio of the metal material to the non-metal material increases as a deposition height increases. That is, the oxygen capturing film 219 may be formed so that a portion close to the adhesive film 121 has a greater metal material concentration than a portion close to the separation film 117. Accordingly, oxygen introduced from the outside of the gate structure GLb may be blocked by the oxygen capturing film 219 before penetrating deep into the oxygen capturing film 219.

For example, when the oxygen capturing film 219 includes TiAlC, the oxygen capturing film 219 may have a distribution in which a ratio of Ti and Al to C increases as a deposition height increases. Also, when the oxygen capturing film 219 includes TaN, the oxygen capturing film 219 may have a distribution in which a ratio of Ta to N increases as a deposition height increases.

In some embodiments, when the oxygen capturing film 219 includes a first metal material and a second metal material, the oxygen capturing film 219 may have a distribution in which a ratio of a metal material having a higher oxygen reactivity increase as a deposition height increases.

Referring to FIG. 5, the semiconductor device 300 of FIG. 5 is similar to the semiconductor device 100 of FIGS. 2A and 2B except that the adhesive film 121 and the gap-fill film 123 of FIGS. 2A and 2B are omitted and an oxygen capturing film 319 fills a remaining space of the gate hole GH. That is, a width of a gate structure GLc and a thickness of each of layers constituting the gate structure GLc may be adjusted according to needs, and thus a material for filling a remaining space of a central portion of the gate hole GH may be added or omitted. Even in this case, a thickness of work function adjusting films 313 and 315 for adjusting a threshold voltage of the semiconductor device 300 may be fixed to an initially designed value.

Accordingly, the gate structure GLc may be formed by sequentially stacking a gate insulating film 311, the work function adjusting films 313 and 315, a separation film 317, and the oxygen capturing film 319 in the gate hole GH.

The oxygen capturing film 319 of the gate structure GLc may be conformably deposited on both side surfaces and a bottom surface of the separation film 317 with a U shape. Since the oxygen capturing film 319 is deposited to fill a remaining space of the gate hole GH, top surfaces of portions of the oxygen capturing film 319 formed on the both side surfaces of the separation film 317 may contact each other to form a seam S. Although oxygen may be introduced along the seam S, the oxygen may be captured by the oxygen capturing film 319. Accordingly, since oxygen ingress into the work function adjusting films 313 and 315 may be impeded or prevented, a threshold voltage applied by the work function adjusting films 313 and 315 may not be substantially changed.

Referring to FIG. 6, the semiconductor device 400 of FIG. 6 is similar to the semiconductor device 100 of FIGS. 2A and 2B except that the gap-fill film 123 of FIGS. 2A and 2B is omitted and an adhesive film 421 fills a remaining space of the gate hole GH. That is, some material layers on an oxygen capturing film 419 may be omitted according to thicknesses of layers constituting a gate structure GLd and a width of the gate structure GLd.

Accordingly, a gate insulating film 411, work function adjusting films 413 and 415, a separation film 417, and the oxygen capturing film 419 of the semiconductor device 400 may be sequentially conformably formed on both side surfaces and a bottom surface of the gate hole GH. Also, the adhesive film 421 may be formed on the oxygen capturing film 419 to fill a remaining space of the gate hole GH.

Figure 7A:
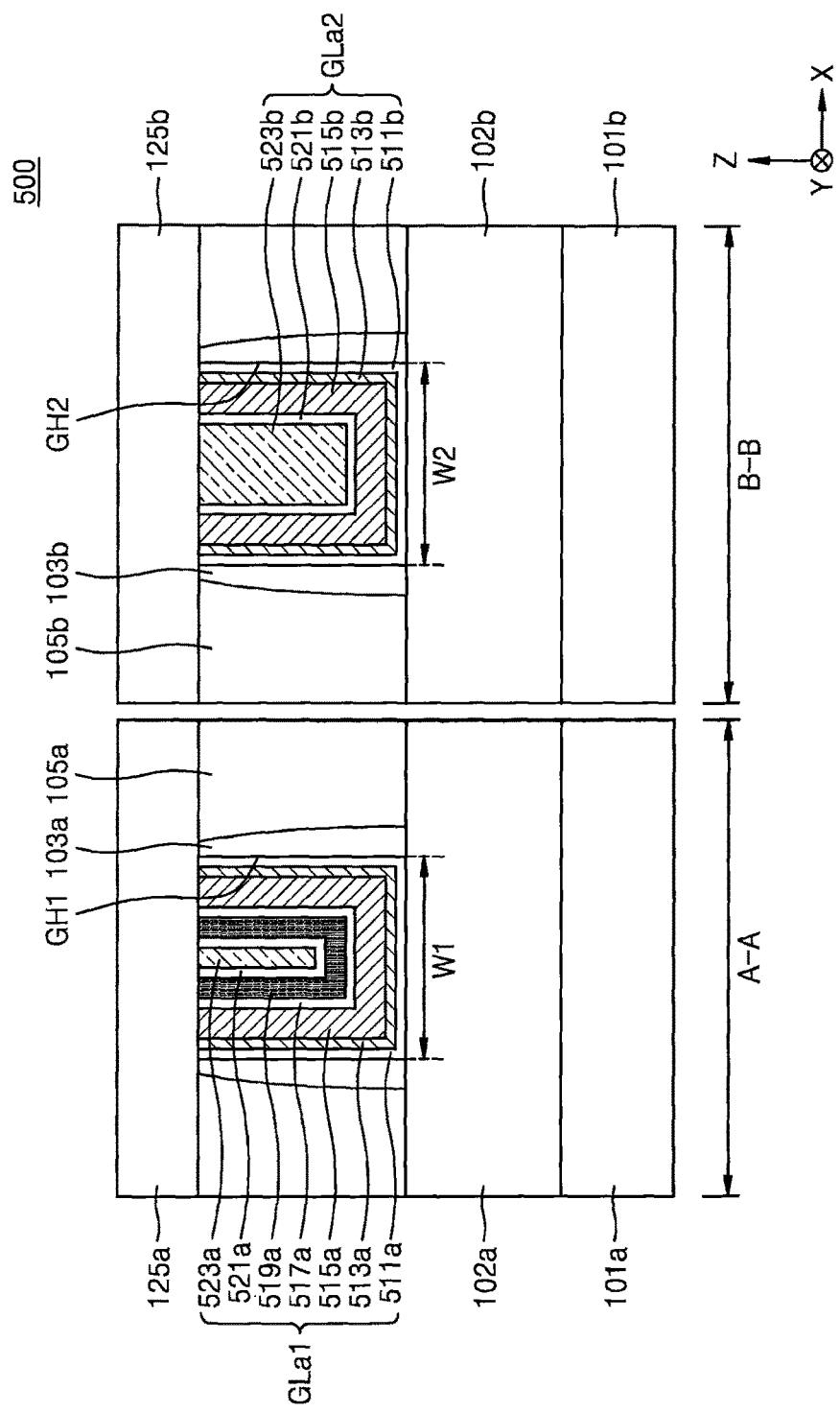
FIGS. 7A through 8 are cross-sectional views of semiconductor devices according to other embodiments, a region A-A in each of FIGS. 7A through 8 corresponding to a cross-sectional view taken along line A1-A1 of FIG. 1 and a region B-B in each of FIGS. 7A through 8 corresponding to a cross-sectional view taken along line B-B of FIG. 1.
Figure 7B:
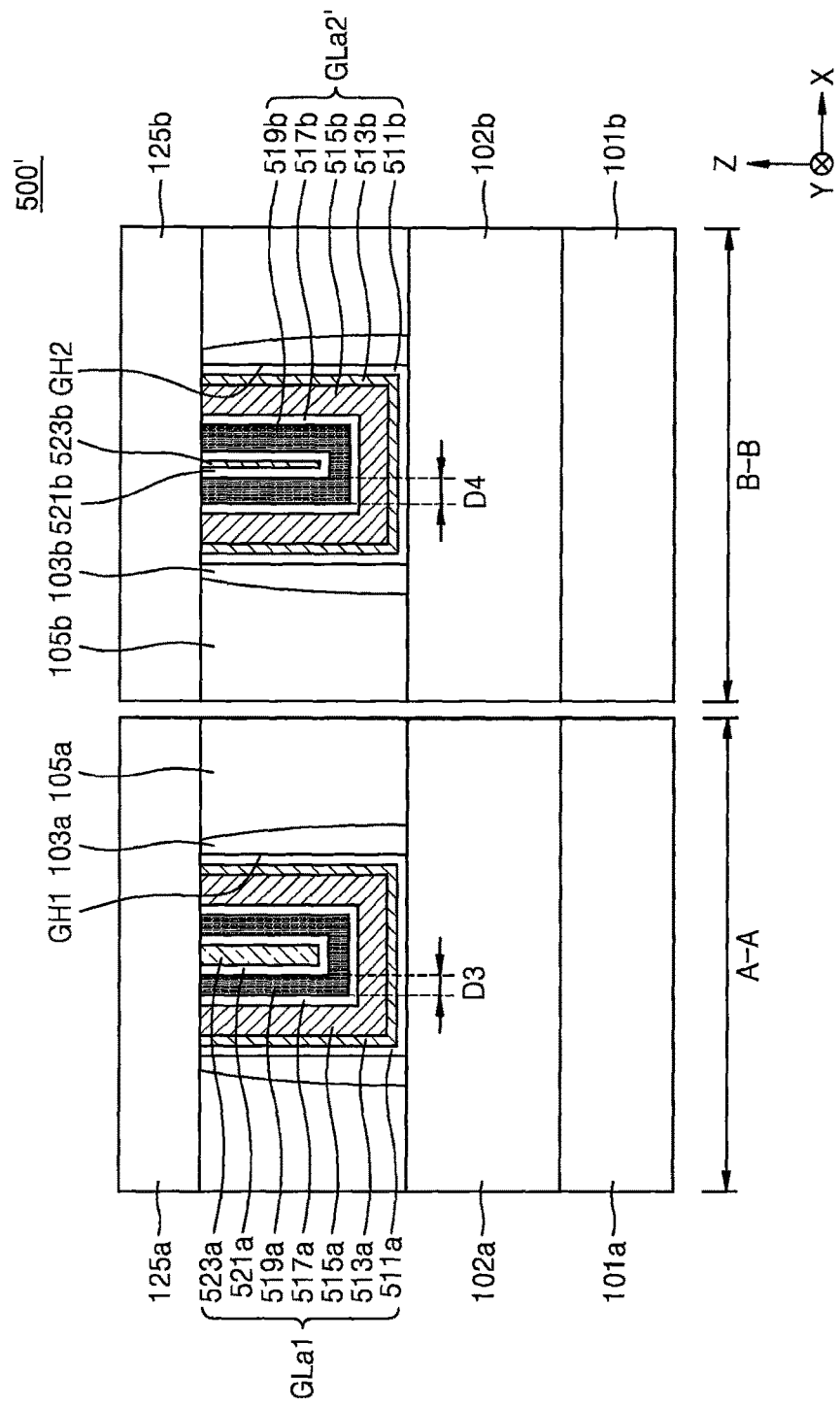
Figure 8:
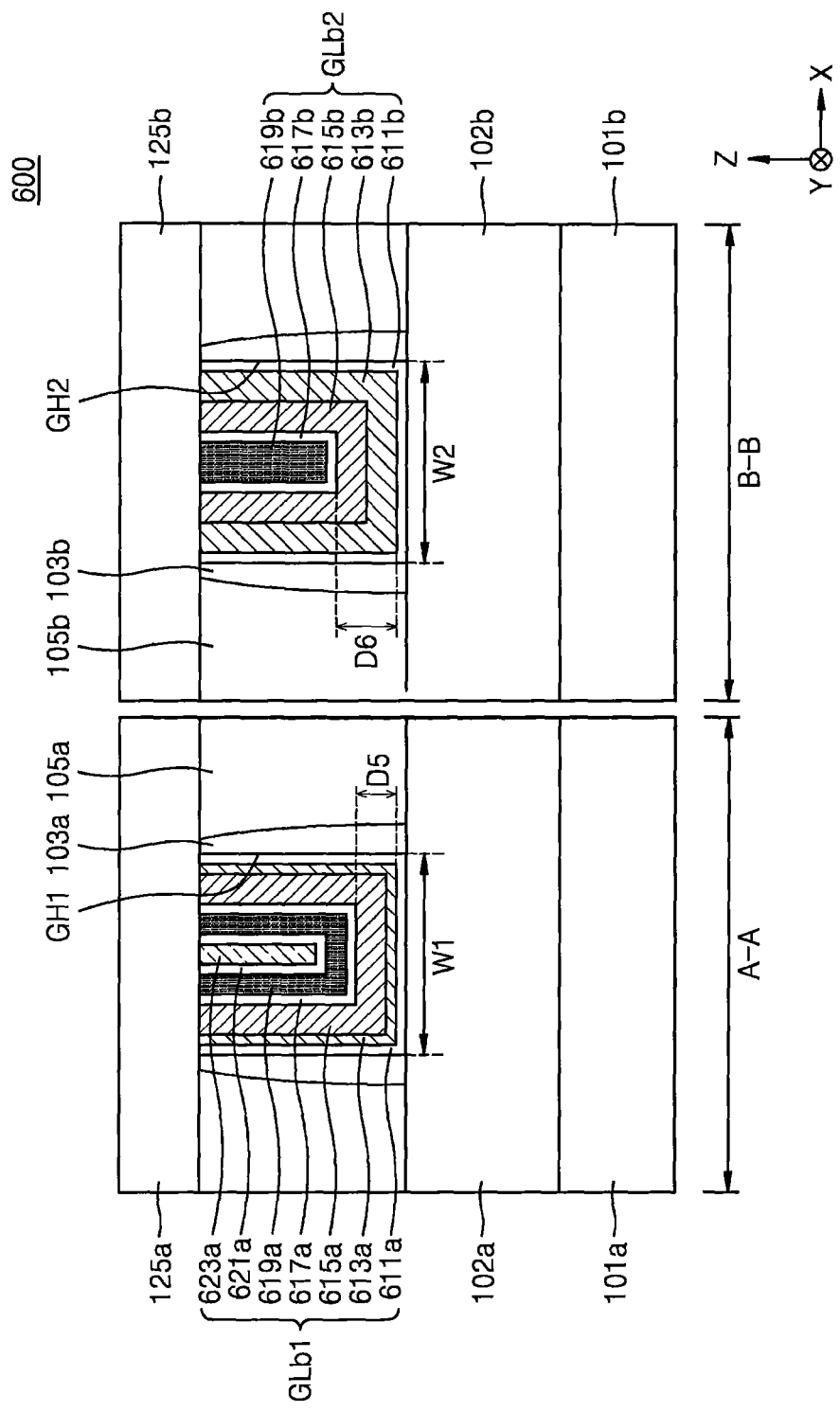

FIGS. 7A through 8 are cross-sectional views of semiconductor devices 500, 500', and 600 according to other embodiments. A region A-A in each of FIGS. 7A through 8 corresponds to a cross-sectional view taken along line A1-A1 of FIG. 1. The first gate structure GL1 of FIG. 1 may correspond to a first gate structure GLa1 of FIGS. 7A and 7B and a first gate structure GLb1 of FIG. 8. Also, a region B-B in each of FIGS. 7A through 8 corresponds to a cross-sectional view taken along line B-B of FIG. 1. The second gate structure GL2 of FIG. 1 may correspond to a second gate structure GLa2 of FIG. 7A and a second gate structure GLb2 of FIG. 8.

Referring to FIG. 7A, the semiconductor device 500 may include the first gate structure GLa1 and the second gate structure GLa2 that is different from the first gate structure GLa1. In this case, the first gate structure GLa1 may be an n-type gate structure and the second gate structure GLa2 may be a p-type gate structure.

Although not shown in FIG. 7A, in the region A-A, an active region with a fin shape protruding from a semiconductor substrate 101a beyond the top of a first device isolation film 102a may contact the first gate structure GLa1 to form an n-type channel. Likewise, in the region B-B, an active region with a fin shape protruding from a semiconductor substrate 101b beyond the top of a second device isolation film 102b may contact the second gate structure GLa2 to form a p-type channel.

The first and second gate structures GLa1 and GLa2 may be respectively formed in first and second gate holes GH1 and GH2 defined by first and second spacers 103a and 103b. One side surfaces of the first and second spacers 103a and 103b may respectively contact first interlayer insulating films 105a and 105b formed on the first and second device isolation films 102a and 102b. A second interlayer insulating film 125a may be formed on the first gate structure GLa1 and the first interlayer insulating film 105a, and a second interlayer insulating film 125b may be formed on the second gate structure GLa2 and the first interlayer insulating film 105b.

The first gate structure GLa1 may be substantially the same as the gate structure GLa of FIGS. 2A and 2B. That is, a first gate insulating film 511a, first work function adjusting films 513a and 515a, a first separation film 517a, a first oxygen capturing film 519a, a first adhesive film 521a, and a first gap-fill film 523a may be sequentially stacked on both side surfaces and a bottom surface of the first gate hole GH1.

The second gate structure GLa2 may correspond to the first gate structure GLa1 except in that the first separation film 517a and the first oxygen capturing film 519a of the first gate structure GLa1 are omitted. Accordingly, an oxygen concentration in the first work function adjusting films 513a and 515a may be less than an oxygen concentration in second work function adjusting films 513b and 515b. Although the first gate structure GLa1 and the second gate structure GLa2 have corresponding films, the corresponding films may include different materials.

The first oxygen capturing film 519a may be formed of a metal material having a high oxygen reactivity such as TiAlC, TiAl, Al, Ti, TaN, Ta, or a combination thereof. However, a metal material having a high oxygen reactivity may have a higher electrical resistance than other metal materials. Accordingly, in the semiconductor device 500 including a plurality of gate structures, that is, the first and second gate structures GLa1 and GLa2, an electrical resistance may need to be reduced, and thus an oxygen capturing film may not be formed in a p-type gate structure having a relatively small risk of oxygen ingress.

Accordingly, the second gate structure GLa2 may be formed by sequentially stacking a second gate insulating film 511b, the second work function adjusting films 513b and 515b, a second adhesive film 521b, and a second gap-fill film 523b on both side surfaces and a bottom surface of the second gate hole GH2. The second gap-fill film 523b may fill a remaining space of the second gate hole GH2 on the second adhesive film 521b. The second gap-fill film 523b may have a lower resistivity than a material of the first oxygen capturing film 519a such as TiAlC, TiAl, Al, Ti, TaN, Ta, or a combination thereof.

Although there is a structural difference between the first work function adjusting films 513a and 515a and the second work function adjusting films 513b and 515b in FIG. 7A, the inventive concept is not limited thereto. In some embodiments, the second gap-fill film 523b may be formed by stacking a plurality of films.

As such, the semiconductor device 500 may selectively include the oxygen capturing film 519a to improve individual properties of the first and second gate structures GLa1 and GLa2.

Referring to FIG. 7B, the semiconductor device 500' may include the first gate structure GLa1 and a second gate structure GLa2' that is different from the first gate structure GLa1. In this case, the first gate structure GLa1 may be an n-type gate structure and the second gate structure GLa2' may be a p-type gate structure.

The first gate structure GLa1 may be the same as that described with reference to FIG. 7A.

Each layer of the second gate structure GLa2' may correspond to that of the first gate structure GLa1. That is, the second gate structure GLa2' may be formed by stacking the second gate insulating film 511b, the second work function adjusting films 513b and 515b, the second separation film 517b, the second oxygen capturing film 519b, the second adhesive film 521b, and the second gap-fill film 523b.

In this case, a thickness of the first work function adjusting films 513a and 515a of the first gate structure GLa1 may be the same as that of the second work function adjusting films 513b and 515b of the second gate structure GLa2'. However, a first thickness D3 of the first oxygen capturing film 519a included in the first gate structure GLa1 may be different from a second thickness D4 of the second oxygen capturing film 519b included in the second gate structure GLa2'.

Since the first and second gate structures GLa1 and GLa2' include the first and second work function adjusting films 513a, 515a, 513b, and 515b having the same thickness, the first and second gate structures GLa1 and GLa2' may have substantially the same threshold voltage. That is, since the first and second oxygen capturing films 519a and 519b may impede or prevent oxygen ingress into the first and second work function adjusting films 513a, 515a, 513b, and 515b, initially designed work function values may be maintained and work functions and threshold voltages of the first and second gate structures GLa1 and GLa2' may not be changed.

However, in detail, a difference between the first and second thicknesses D3 and D4 of the first and second oxygen capturing films 519a and 519b may affect oxygen ingress into the first and second work function adjusting films 513a, 515a, 5613b, and 515b, thereby leading to a slight change in work functions and threshold voltages of the first and second gate structures GLa1 and GLa2'. In some embodiments, the first thickness D3 of the first oxygen capturing film 519a may be less by about 10 Å than the second thickness D4 of the second oxygen capturing film 519b. In this case, a threshold voltage of the first gate structure GLa1 may be higher by about 0.05% or less than a threshold voltage of the second gate structure GLa2'. Since a difference between the threshold voltages is very small, the first and second gate structures GLa1 and GLa2' may operate at substantially the same threshold voltage in the semiconductor device 500'.

Referring to FIG. 8, the semiconductor device 600 may include the first gate structure GLb1 and the second gate structure GLb2 that is different from the first gate structure GLb1. In this case, the first gate structure GLb1 may be an n-type gate structure and the second gate structure GLb2 may be a p-type gate structure.

The first gate structure GLb1 may be substantially the same as the gate structure GLa of FIGS. 2A and 2B. That is, a first gate insulating film 611a, first work function adjusting films 613a and 615a, a first separation film 617a, a first oxygen capturing film 619a, a first adhesive film 621a, and a first gap-fill film 623a may be sequentially stacked on both side surfaces and a bottom surface of the first gate hole GH1. In this case, the first work function adjusting films 613a and 615a may have a first thickness D5.

The second gate structure GLb2 may correspond to the first gate structure GLb1 except that the second gate structure GLb2 includes second work function adjusting films 613b and 615b having a second thickness D6 greater than the first thickness D5. When the first gate structure GLb1 is an n-type gate structure and the second gate structure GLb2 is a p-type gate structure, operation characteristics may be improved due to a thickness difference between the first and second work function adjusting films 613a, 615a, 613b, and 615b.

The second work function adjusting films 613b and 615b may be conformably deposited to the second thickness D6 on both side surfaces and a bottom surface of the second gate hole GH2. As a volume of the second work function adjusting films 613b and 615b in the second gate hole GH2 increases, some upper films of the first gate structure GLb1, for example, films corresponding to the first adhesive film 621a and the first gap-fill film 623a, may be omitted. That is, a second separation film 617b and a second oxygen capturing film 619b may be formed on the second work function adjusting films 613b and 615b and a remaining space of the second gate hole GH2 may be filled with the second oxygen capturing film 619b.

Accordingly, the first oxygen capturing film 619a included in the first gate structure GLb1 may have a U shape according to a shape of the first gate hole GH1, and the second oxygen capturing film 619b included in the second gate structure GLb2 may have an I shape at a central portion of the second gate hole GH2. Despite a shape difference between the first and second oxygen capturing films 619a and 619b, oxygen may be impeded or prevented from penetrating into the work function adjusting films 613a, 615a, 613b, and 615b due to the first and second oxygen capturing films 619a and 619b.

As such, the semiconductor device 600 may adopt a structure for improving operation characteristics of the first and second gate structures GLb1 and GLb2 and may include the first and second oxygen capturing films 619a and 619b for reducing or preventing degradation of the first and second work function adjusting films 613a, 615a, 613b, and 615b.

Although a first width W1 of a short side of the first gate structure GLa1 and a second width W2 of a short side of the second gate structure GLa2 are substantially the same in FIG. 8, some embodiments of the inventive concepts are not limited thereto. Accordingly, even when the second work function adjusting films 613b and 615b are formed to be thicker than the first work function adjusting films 613a and 615a, each film may not be omitted by forming the second gate hole GH2 so that the second gate hole GH2 has a large width.

In some embodiments, when the first gate structure GLa1 is an n-type gate structure and the second gate structure GLa2 is a p-type gate structure, the second gate structure GLa2 may include the second work function adjusting films 513b and 515 and the first gate structure GLa1 may not include the first work function adjusting films 513a and 515a.

Figure 9:
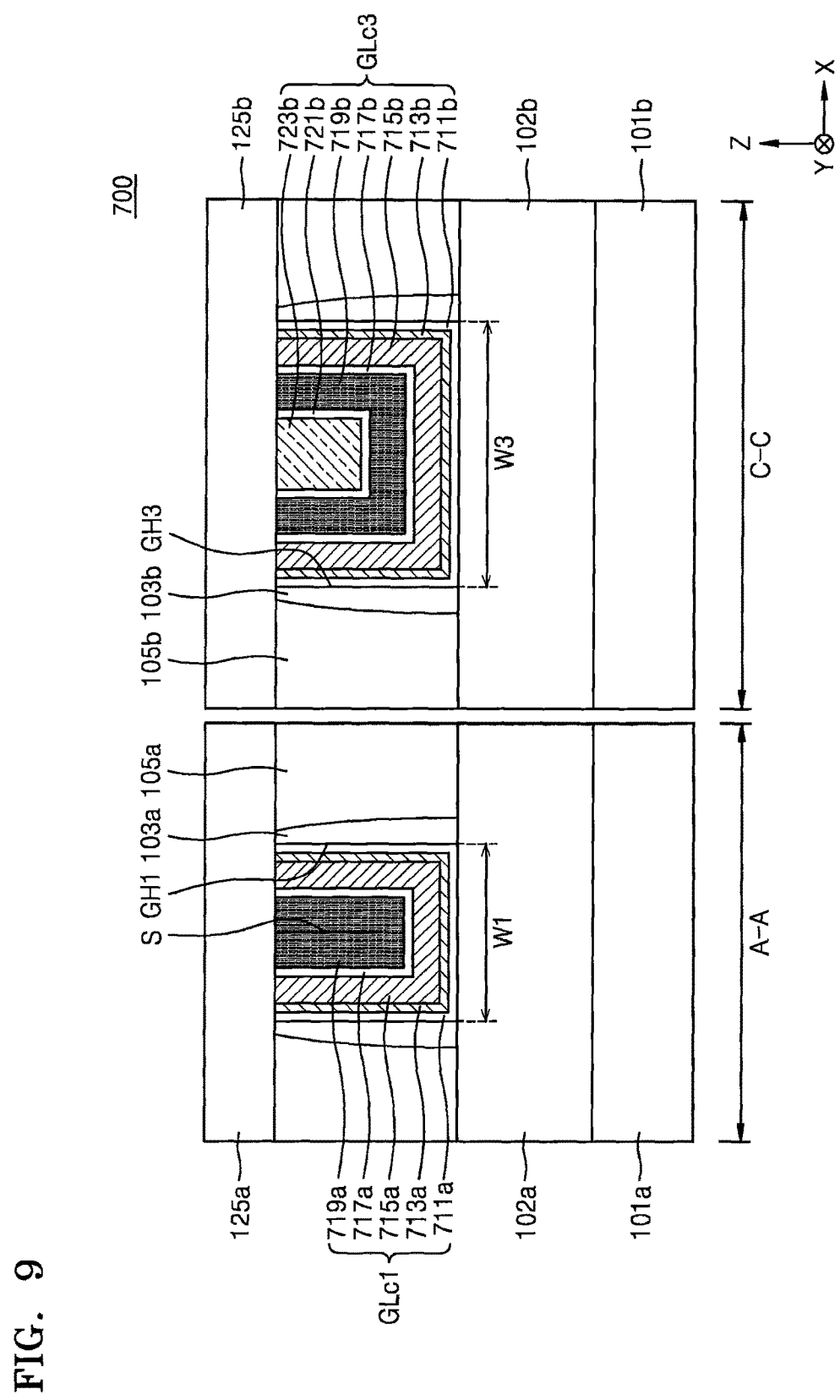
FIGS. 9 and 10 are cross-sectional views of semiconductor devices according to other embodiments, a region A-A in each of FIGS. 9 and 10 corresponding to a cross-sectional view taken along line A1-A1 of FIG. 1 and a region C-C in each of FIGS. 9 and 10 corresponding to a cross-sectional view taken along line C-C of FIG. 1.
Figure 10:
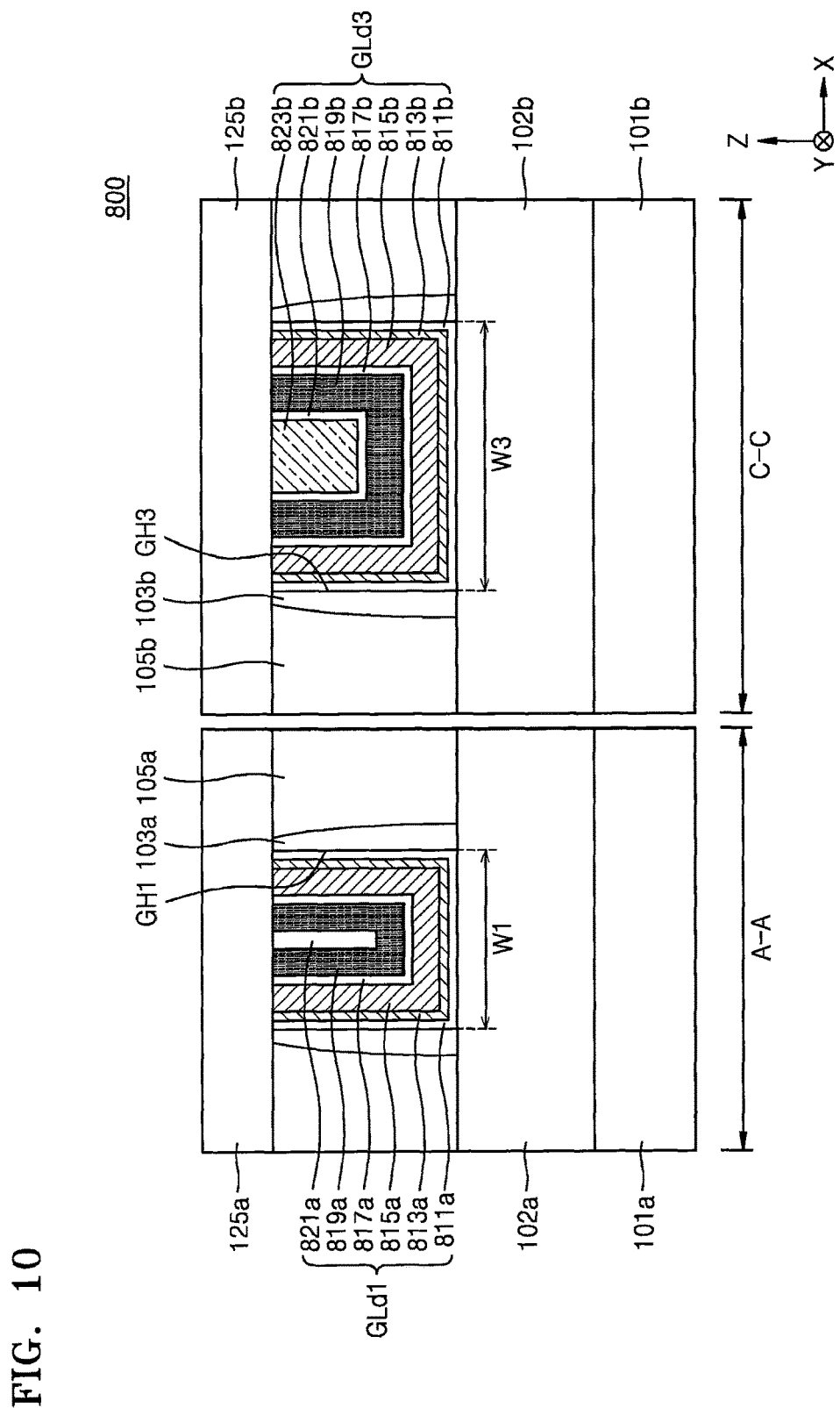

FIGS. 9 and 10 are cross-sectional views of semiconductor devices 700 and 800 according to other embodiments of the inventive concepts. A region A-A in each of FIGS. 9 and 10 corresponds to a cross-sectional view taken along line A1-A1 of FIG. 1. The first gate structure GL1 of FIG. 1 may correspond to a first gate structure GLc1 of FIG. 9 and a first gate structure GLd1 of FIG. 10. Also, a region C-C in each of FIGS. 9 and 10 corresponds to a cross-sectional view taken along line C-C of FIG. 1. The third gate structure GL3 of FIG. 1 may correspond to a third gate structure GLc3 of FIG. 9 and a third gate structure GLd3 of FIG. 10.

Referring to FIG. 9, the semiconductor device 700 may include the first gate structure GLc1 and the third gate structure GLc3 that is different from the first gate structure GLc1. In this case, the first gate structure GLc1 formed in the region A-A may constitute a transistor of a cell region densely formed according to a general design rule. Also, the third gate structure GLc3 formed in the region B-B may constitute a transistor of a logic region or a peripheral region larger than the transistor of the cell region.

A third width W3 of the third gate structure GLc3 may be greater than a first width W1 of the first gate structure GLc1. In some embodiments, the third width W3 of the third gate structure GLc3 may be, but not limited to, 2 times or more greater than the first width W1 of the first gate structure GLc1.

The first gate structure GLc1 may not include some upper layers included in the third gate structure GLc3, for example, a third adhesive film 721b and a third gap-fill film 723b. That is, the first gate structure GLc1 may be formed by sequentially stacking a first gate insulating film 711a, first work function adjusting films 713a and 715a, and a first separation film 717a on both side surfaces and a bottom surface of the first gate hole GH1, and a first oxygen capturing film 719a may be formed on the first separation film 717a to fill a remaining space at a central portion of the first gate hole GH1. The first gate structure GLc1 may be substantially the same as the gate structure GLc of FIG. 5, and a detailed explanation thereof will not be given.

In contrast, the third gate structure GLc3 may be formed by sequentially stacking a third gate insulating film 711b, third work function adjusting films 713b and 715b, a third separation film 717b, a third oxygen capturing film 719b, and the third adhesive film 721b on both side surfaces and a bottom surface of the third gate hole GH3, and the third gap-fill film 723b may be formed on the third adhesive film 721b to fill a remaining space at a central portion of the third gate hole GH3.

Referring to FIG. 10, the semiconductor device 800 of FIG. 10 may be similar to the semiconductor device 700 of FIG. 9 except that the first gate structure GLd1 further includes a first adhesive layer 821a formed on a first oxygen capturing film 819a and the first adhesive layer 821a fills a remaining space at a central portion of the first gate hole GH1. That is, thicknesses of layers constituting the first gate structure GLd1 may be adjusted according to needs, and thus a material for filling a remaining space at a central portion of the first gate hole GH1 may be added or omitted.

Accordingly, the first gate structure GLd1 may be formed by sequentially conformably stacking a first gate insulating film 811a, first work function adjusting films 813a and 815a, a first separation film 817a, and the first oxygen capturing film 819a on both side surfaces and a bottom surface of the first gate hole GH1. Also, the first adhesive film 821a may be formed on the first oxygen capturing film 819a to fill a remaining space of the first gate hole GH1.

Also, the third gate structure GLd3 may be formed by sequentially conformably stacking a third gate insulating film 811b, third work function adjusting films 813b and 815b, a third separation film 817b, and a third oxygen capturing film 819b on both side surfaces and a bottom surface of the third gate hole GH3. Also, a third adhesive film 821b may be formed on the third oxygen capturing film 819b to fill a remaining space of the third gate hole GH3.

The first gate structure GLd1 may be substantially the same as the gate structure GLd of FIG. 6, and a detailed explanation thereof will not be given.

FIGS. 11A through 14B are cross-sectional views according to a process order for explaining a method of manufacturing the semiconductor device 100 according to some embodiments. FIGS. 11A, 12A, 13A, and 14A are cross-sectional views according to a process order taken along line A1-A1 of FIG. 1. FIGS. 11B, 12B, 13b, and 14B are cross-sectional views according to a process order taken along line A2-A2 of FIG. 1.

Figure 11A:
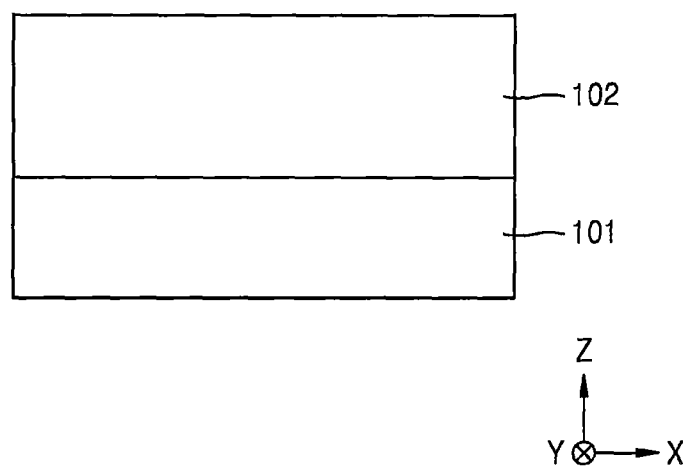
FIGS. 11A through 14B are cross-sectional views according to a process order for explaining a method of manufacturing the semiconductor device according to embodiments, FIGS. 11A, 12A, 13A, and 14A being cross-sectional views according to a process order taken along line A-A1 of FIG. 1 and FIGS. 11B, 12B, 13B, and 14B being cross-sectional views according to a process order taken along line A2-A2 of FIG. 1.
Figure 11B:
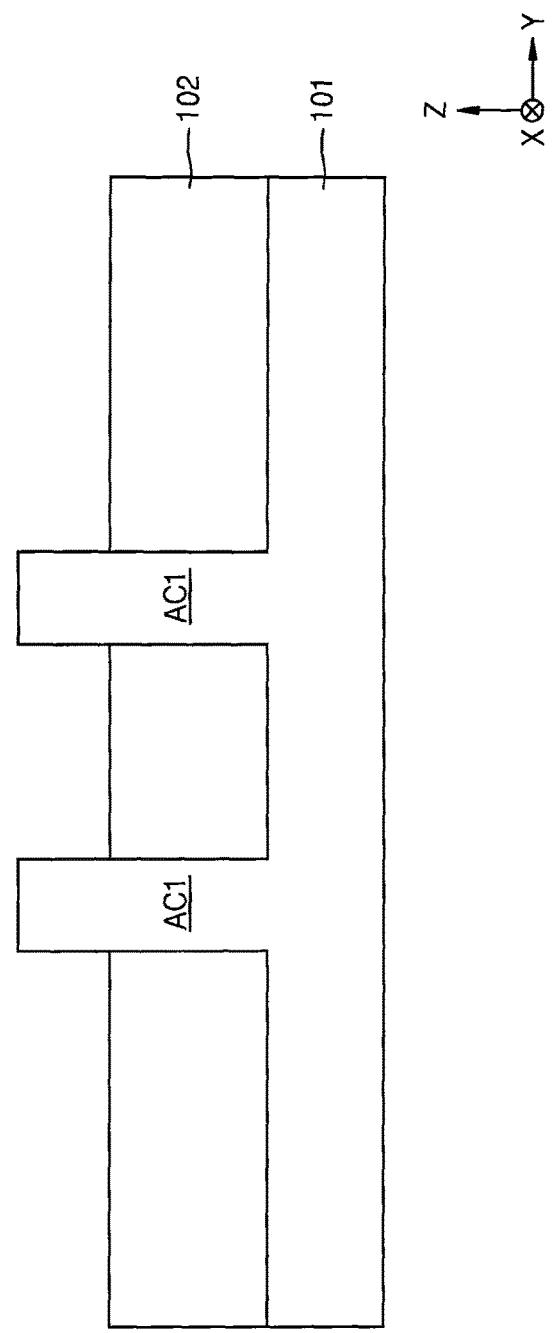

Referring to FIGS. 11A and 11B, a plurality of active regions AC1 with fin shapes protruding in a third direction (e.g., a Z-direction) from the semiconductor substrate 101 that extends in a first direction (e.g., an X-direction) and a second direction (e.g., a Y-direction) and extending in the first direction may be formed. The plurality of active regions AC1 may include regions doped with p-type or n-type impurities according to a channel type.

After an insulating material film that covers the plurality of active regions AC1 with the fin shapes is formed, the device isolation film 102 may be formed by etching back the insulating material film. Upper portions of the plurality of active regions AC1 with the fin shapes may protrude beyond the top of the device isolation film 102 to be exposed.

Figure 12A:
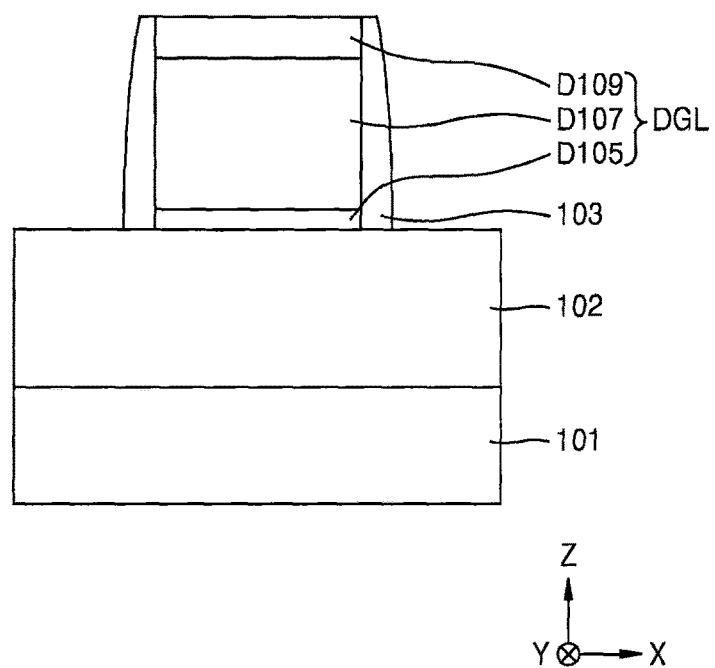
Figure 12B:
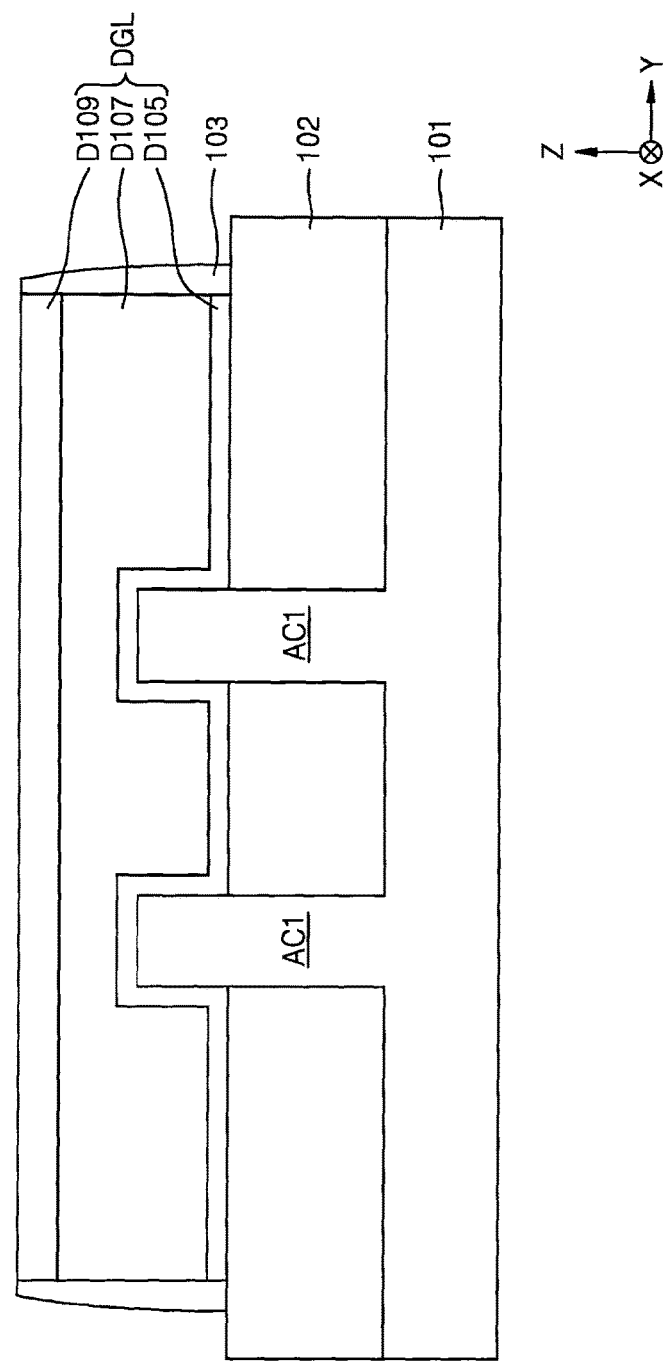

Referring to FIGS. 12A and 12B, a dummy gate structure DGL extending in the second direction (e.g., the Y-direction) different from the first direction (e.g., the X-direction) in which the active regions AC1 with the fin shapes extend to cross the active regions AC1 with the fin shapes may be formed.

The dummy gate structure DGL may include a dummy gate insulating film D105, a dummy gate electrode D107, and a dummy gate capping layer D109 that are sequentially stacked on the plurality of active regions CA1 with the fin shapes. In some embodiments, the dummy gate insulating film D105 may include silicon oxide. The dummy gate electrode D107 may include polysilicon. The dummy gate capping layer D109 may include at least one of silicon oxide, silicon nitride, and silicon oxynitride.

Next, the spacer 103 may be formed on both side surfaces of the dummy gate structure DGL. Next, an epitaxial layer may be grown on exposed portions of the plurality of active regions AC1 with the fin shapes and source and rain regions with various cross-sectional shapes may be formed by doping impurities.

Figure 13A:
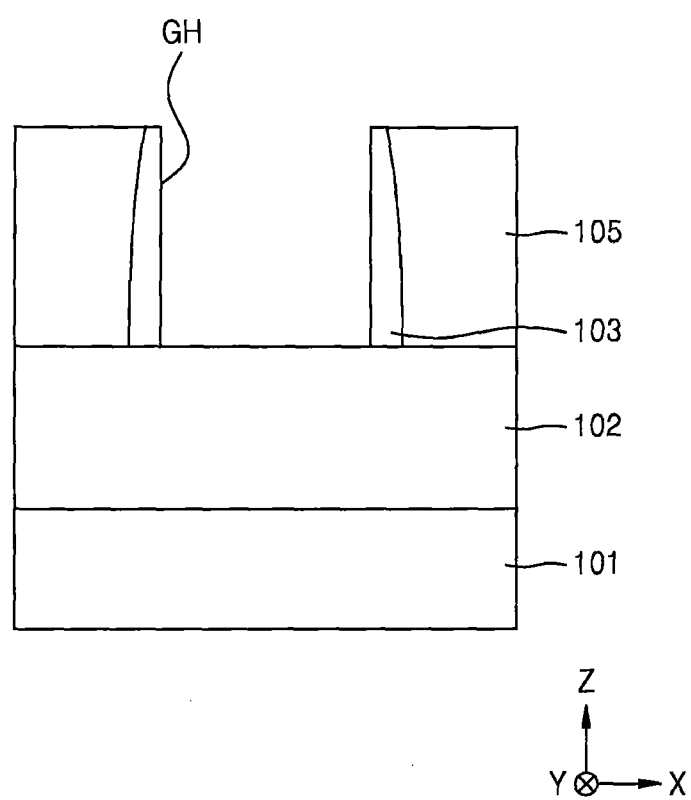
Figure 13B:
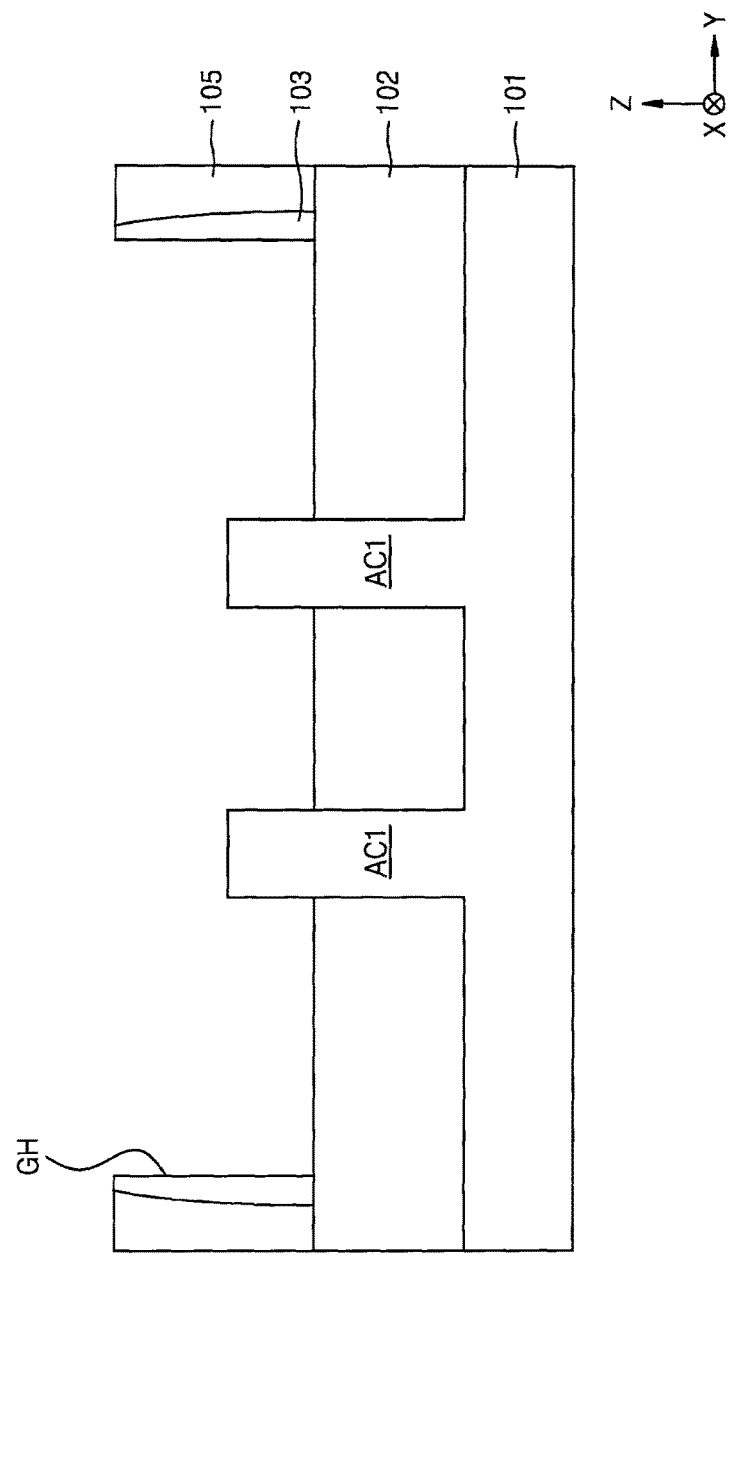

Referring to FIGS. 13A and 13B, an insulating material film may be formed to sufficiently cover the dummy gate structure DGL and the plurality of active regions AC1 with the fin shapes. The first interlayer insulating film 105 may be formed by planarizing a resultant structure to expose a top surface of the dummy gate structure DGL.

Next, the gate hole GH may be formed by removing the dummy gate structure DGL exposed through the first interlayer insulating film 105. The spacer 103, the active regions AC1 with the fin shapes, and the device isolation film 102 may be exposed through the gate hole GH.

Figure 14A:
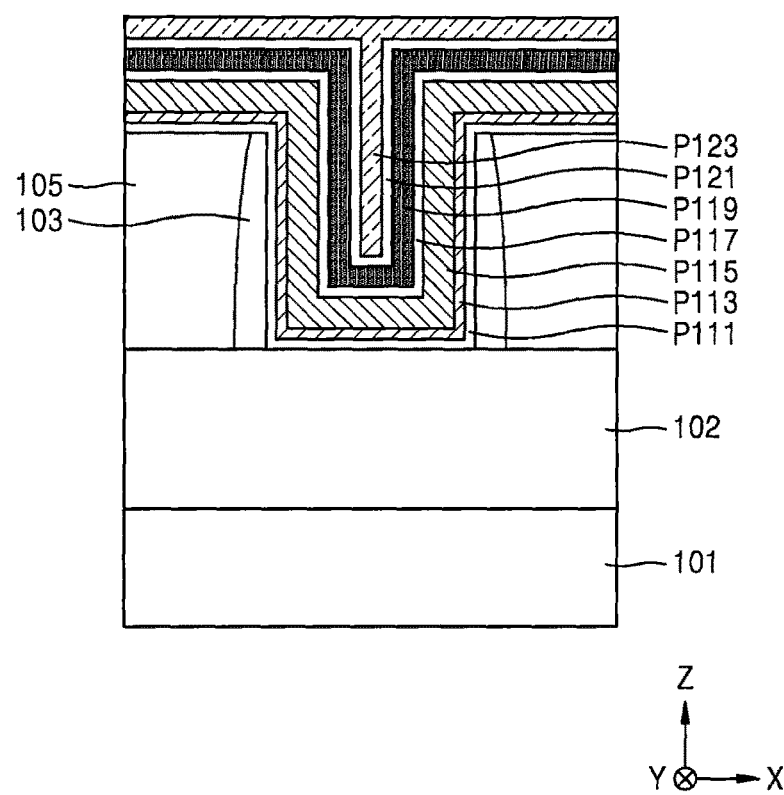
Figure 14B:
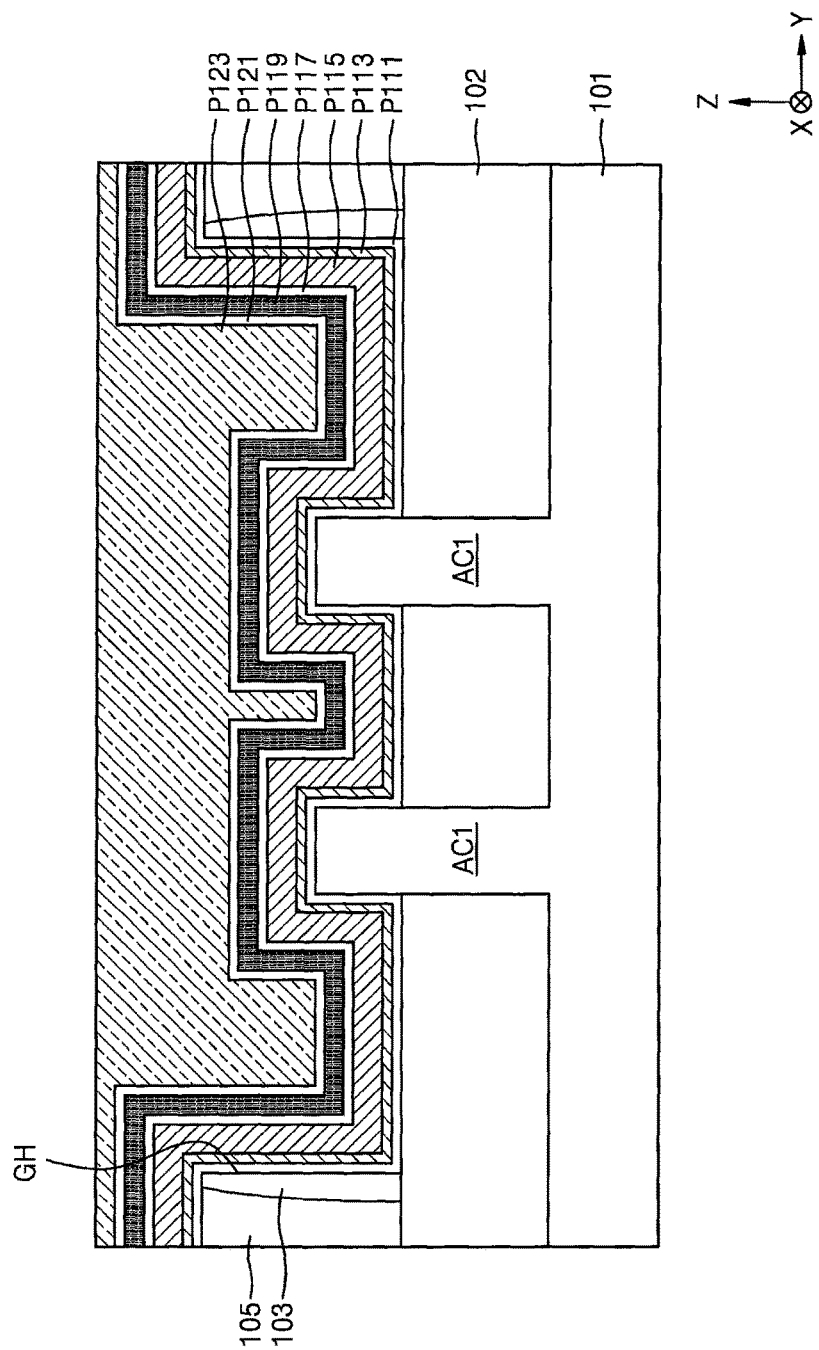

Referring to FIGS. 14A and 14B, a preliminary gate insulating film P111, preliminary work function adjusting films P113 and P115, a preliminary separation film P117, a preliminary oxygen capturing film P119, a preliminary adhesive film P121, and a preliminary gap-fill film P123 may be sequentially formed to conformably cover a top surface of the first interlayer insulating film 105 and both side surfaces and a bottom surface of the gate hole GH. Each of the preliminary gate insulating film P111, the preliminary work function adjusting films P113 and P115, the preliminary separation film P117, the preliminary oxygen capturing film P119, the preliminary adhesive film P121, and the preliminary gap-fill film P123 may be formed by using ALD, MOALD, CVD, MOCVD, or PVD.

Referring back to FIGS. 2A and 2B, the preliminary gate insulating film P111, the preliminary work function adjusting films P113 and P115, the preliminary separation film P117, the preliminary oxygen capturing film P119, the preliminary adhesive film P121, and the preliminary gap-fill film P123 may remain only in the gate hole GH after performing a planarization process on a resultant structure of FIGS. 13A and 13B. Accordingly, the gate structure GLa in which the gate insulating film 111, the work function adjusting films 113 and 115, the separation film 117, the oxygen capturing film 119, the adhesive film 121, and the gap-fill film 123 are sequentially stacked in the gate hole GH may be formed.

Next, the second interlayer insulating film 125 may be formed on the gate structure GLa and the first interlayer insulating film 105. Although not shown, a plurality of conductive contact plugs may pass through the first and second interlayer insulating films 105 and 125 and may be connected to the active regions AC1 with the fin shapes. The plurality of conductive contact plugs may be connected to the source and drain regions of the active regions AC1. Although not shown, wiring lines may be formed only on the second interlayer insulating film 125. Some of the wiring lines may be power wiring lines or ground wiring lines.

A method of manufacturing the semiconductor devices 200, 300, and 400 of FIGS. 4 through 6 will now be explained with reference to a process order of FIGS. 11A through 14B.

Referring to FIGS. 4, and 11A through 14B, according to a method of manufacturing the semiconductor device 200 of FIG. 4, processes of FIGS. 11A through 13B may be first performed. Next, the gate insulating film 111, the work function adjusting films 113 and 115, and the separation film 117 may be formed on both side surfaces and a bottom surface of the gate hole GH to conformably cover the both side surfaces and the bottom surface of the gate hole GH and the first interlayer insulating film 105.

Next, a flow rate of each material in a chamber where a deposition process is performed may be adjusted so that a ratio of a specific material increases as a deposition height of the oxygen capturing film 219 on the separation film 117 increases.

In some embodiments, when the oxygen capturing film 219 having a distribution in which a ratio of a metal material to a non-metal material increases as a deposition height increases is formed, a flow rate ratio of each material may be adjusted to reduce a flow rate of the non-metal material and to increase a flow rate of the metal material as deposition is performed on the oxygen capturing film 219.

Also, in some embodiments, when the oxygen capturing film 219 having a distribution in which a ratio of a second metal material to a first metal material increases as a deposition height increases is formed, a flow rate of each material may be adjusted to reduce a flow rate of the first metal material and to increase a flow rate of the second metal material as deposition is performed on the oxygen capturing film 219.

Accordingly, the oxygen capturing film 219 may have a distribution in which a ratio of a plurality of materials varies and may be formed to conformably cover the both side surfaces and the bottom surface of the gate hole GH and the first interlayer insulating film 105.

Next, the adhesive film 121 and the gap-fill film 123 may be formed on the oxygen capturing film 219 and the gate structure GLb may be formed by performing a planarization process. Next, the semiconductor device 200 of FIG. 4 may be formed by forming the second interlayer insulating film 125 on the gate structure GLb. A detailed process is the same as that described with reference to FIGS. 14A and 14B.

Referring to FIGS. 5, and 11A through 14B, a method of manufacturing the semiconductor device 300 of FIG. 5 may correspond to processes of FIGS. 11A through 14B except that a remaining space of the gate hole GH may be filled with the oxygen capturing film 319 in a process of forming layers in the gate hole GH in FIGS. 14A and 14B. Accordingly, a process of forming the adhesive film 121 and the gap-fill film 125 of FIGS. 14A and 14B may be omitted.

Referring to FIGS. 6, and 11A through 14B, a method of manufacturing the semiconductor device 400 of FIG. 6 may correspond to processes of FIGS. 11A through 14B except that a remaining space of the gate hole GH may be filled with the adhesive film 421 in a process of forming layers in the gate holes GH in FIGS. 14A and 14B. Accordingly, a process of forming the gap-fill film 123 of FIGS. 14A and 14B may be omitted.

Figure 15:
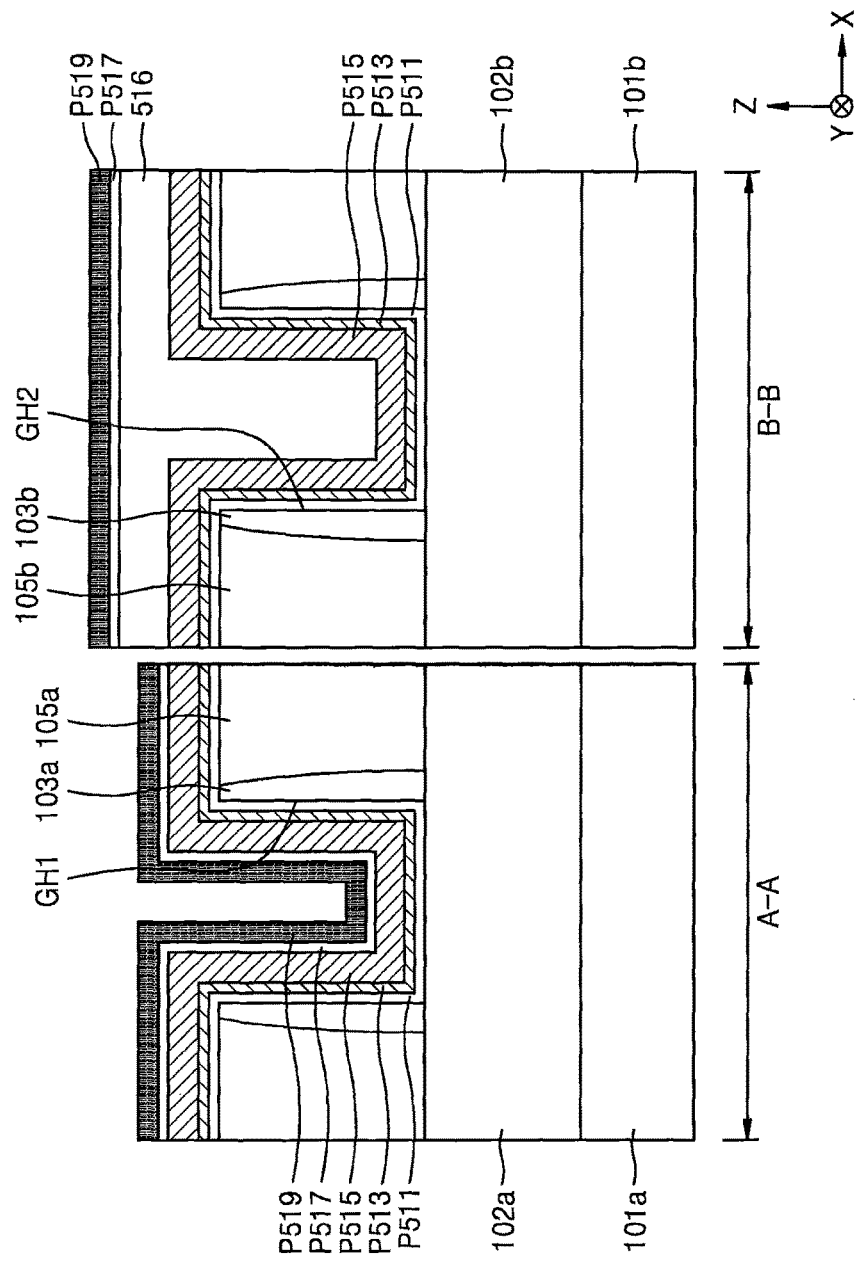
FIGS. 15 and 16 are cross-sectional views according to a process order for explaining a method of manufacturing the semiconductor device according to embodiments, a region A-A in each of FIGS. 15 and 16 corresponding to a cross-sectional view taken along line A1-A1 of FIG. 1 and a region B-B in each of FIGS. 15 and 16 corresponding to a cross-sectional view taken along line B-B of FIG. 1.
Figure 16:
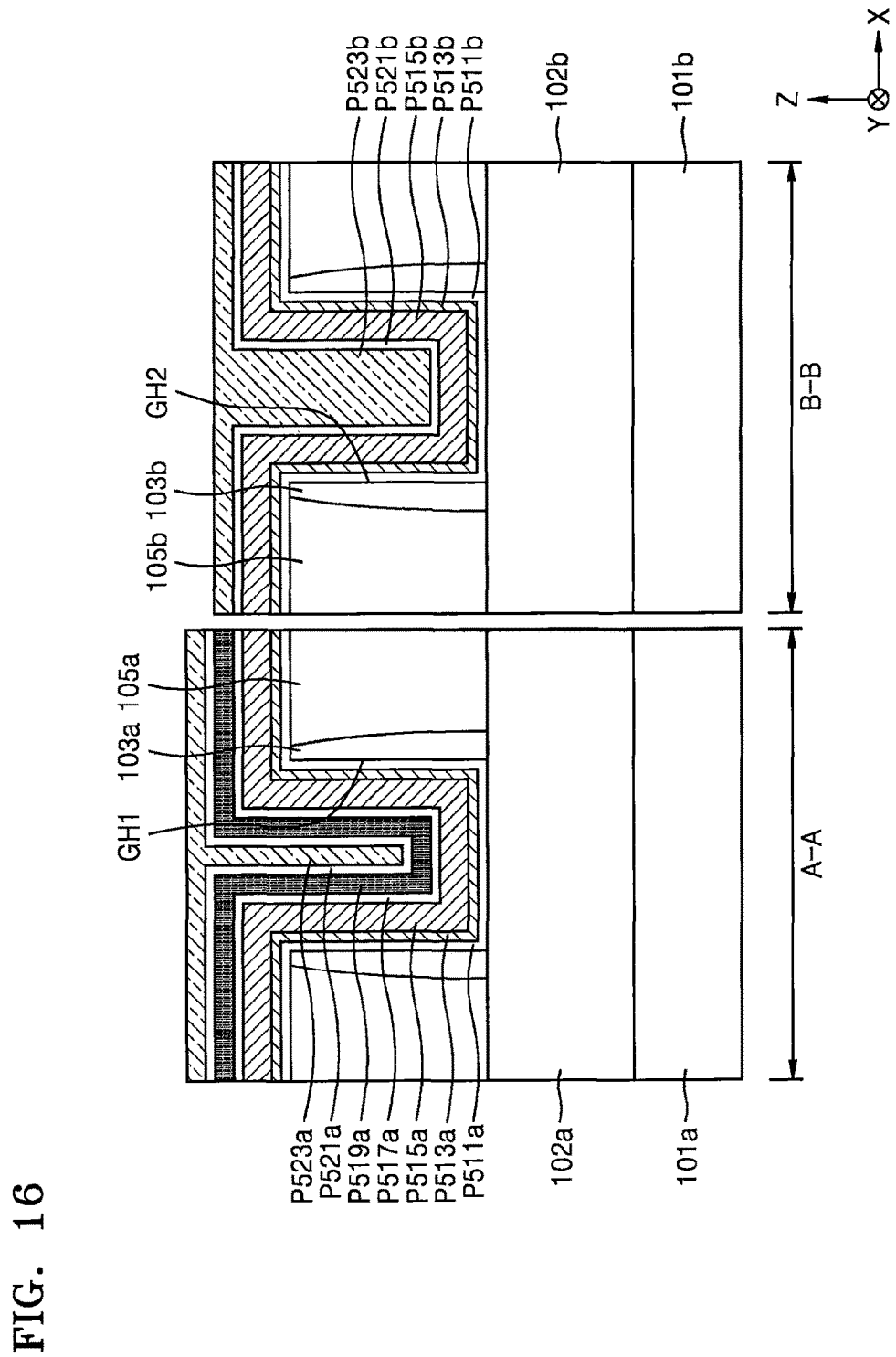

FIGS. 15 and 16 are cross-sectional views according to a process order for explaining a method of manufacturing the semiconductor device 500 of FIG. 7A according to embodiments. A region A-A in each of FIGS. 15 and 16 corresponds to a cross-sectional view taken along line A1-A1 of FIG. 1. A region B-B in each of FIGS. 15 and 16 corresponds to a cross-sectional view taken along line B-B of FIG. 1.

Referring to FIGS. 7A, 11A through 14B, and 15, according to a method of manufacturing the semiconductor device 500, processes of FIGS. 11A through 13B may be simultaneously performed in the regions A-A and B-B in order to form a plurality of gate structures.

Next, preliminary gate insulating films P511a and P511b and preliminary work function adjusting films P513a, P515a, P513b, and P515b may be formed on an entire surface of a resultant structure. Accordingly, the preliminary gate insulating films P511a and P511b and the preliminary work function adjusting films P513a, P515a, P513b, and P515b may be conformally formed on both side surfaces and a bottom surface of the first and second gate holes GH1 and GH2 and on the first interlayer insulating films 105a and 105b.

Next, a mask layer 516 that covers the second gate hole GH2 may be formed so that preliminary separation films P517a and P517b and a preliminary oxygen capturing film P519 are not formed in the second gate hole GH2 in the region B-B.

Next, the preliminary separation film P517 and the preliminary oxygen capturing film P519 may be formed on an entire surface of a resultant structure. Accordingly, the preliminary separation film P517 and the preliminary oxygen capturing film P519 may be conformably formed on the preliminary work function adjusting films P513a and P515a on the both side surfaces and the bottom surface of the first gate hole GH1 in the region A-A whereas the preliminary separation film P517 and the preliminary oxygen capturing film P519 may be formed on the mask layer 516 in the region B-B.

Referring to FIGS. 7A and 16, both the preliminary separation film P517 and the preliminary oxygen capturing film P519 on the mask layer 516 may be removed by removing the mask layer 516 from a resultant structure of FIG. 15.

Next, a preliminary adhesive film P521 and a preliminary gap-fill film P513 may be formed on an entire surface of a resultant structure, and the first gate structure GLa1 and the second gate structure GLa2 may be respectively formed in the region A and the region B-B by performing a planarization process. Next, the semiconductor device 500 of FIG. 7A may be formed by forming the second interlayer insulating films 125 and 125b on the first and second gate structures GL1a and GLa2. A detailed process is the same as that described with reference to FIGS. 14A and 14B.

A method of manufacturing the semiconductor devices 600, 700, and 800 of FIGS. 8 through 10 will now be explained with reference to a process order of FIGS. 11A through 14B, 15, and 16.

Referring to FIGS. 8, 15, and 16, a method of manufacturing the semiconductor device 600 of FIG. 8 may be similar to a method of manufacturing the semiconductor device 500 of FIGS. 15 and 16 except that the second thickness D6 of the second work function adjusting films 613b and 615b of the second gate structure GLb2 is greater than the first thickness D5 of the first work function adjusting films 613a and 615a of the first gate structure GLb1.

In order to form the first gate structure GLb1 and the second gate structure GLb2 so that layers constituting the first gate structure GLb1 and the second gate structure GLb2 have different thicknesses and materials, a mask layer of FIG. 15 may be formed in any one of the region A-A and the region B-B.

Accordingly, the second thickness D6 of the second work function adjusting films 613b and 6145b in the region B-B may be greater than the first thickness D5 of the first work function adjusting films 613a and 615a in the region A-A by forming the mask layer in the region A-A. Alternatively, the mask layer may cover each of the region A-A and the region B-B, and the first work function adjusting films 613a and 615a and the second work function adjusting films 613b and 615b may be respectively formed in the region A-A and the region B-B. Accordingly, materials of the first work function adjusting films 613a and 615a and the second work function adjusting films 613b and 615b may be different from each other.

Referring to FIGS. 9, 10, 15, and 16, a method of manufacturing the semiconductor device 700 of FIG. 9 and the semiconductor device 800 of FIG. 8 may be similar to a method of manufacturing the semiconductor device 500 of FIGS. 15 and 16 except that the third width W3 of the third gate hole GH2 is greater than the first width W1 of the first gate hole GH1. A distribution of layers formed in the first and third gate holes GH1 and GH3 may be changed according to a width difference between the first and third gate holes GH1 and GH3 and a thickness difference between the layers.

In the semiconductor device 700 of FIG. 9, a central portion of the first gate structure GLc1 may be filled with the first oxygen capturing film 719a and elements corresponding to the third adhesive film 721b and the third gap-fill film 723b of the third gate structure GLc3 may be omitted.

Even when elements corresponding to the third adhesive film 721b and the third gap-fill film 723b are omitted from the first gate structure GLc1, the third adhesive film 721b and the third gap-fill film 723b may be deposited on an entire surface of a resultant structure including the region A-A and the region C-C. That is, the third adhesive film 721b and the third gap-fill film 723b may be formed over the first oxygen capturing film 719a that fills the first gate hole GH1.

Next, a planarization process may be performed so that layers remain only in the first and third gate holes GH1 and GH3, and thus the first and third gate structures GLc1 and GLc3 may be formed. Next, the semiconductor device 700 of FIG. 9 may be formed by forming the second interlayer insulating films 125a and 125b on the first and third gate structures GLc1 and GLc3.

In the semiconductor device 800 of FIG. 10, a central portion of the first gate structure GLd1 may be filled with the first adhesive film 821a, and an element corresponding to the third gap-fill film 823b of the third gate structure GLc3 may be omitted. Even in this case, the third gap-fill film 723b may be deposited on an entire surface of a resultant structure including the region A-A and the region C-C, and then the first and third gate structures GLd1 and GLd3 may be formed by using a planarization process. Next, the semiconductor device 800 of FIG. 10 may be formed by forming the second interlayer insulating films 125*a* and 125*b* on the first and third gate structures GLd1 and GLd3.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a semiconductor substrate comprising an active region; and
   a gate structure on the active region,
   wherein the gate structure comprises:
      a gate insulating film;
      a work function adjusting film on the gate insulating film;
      a separation film on the work function adjusting film; and
      an oxygen capturing film on the separation film and configured to capture oxygen introduced from outside the gate structure, wherein the oxygen capturing film comprises a metal material and a non-metal material and a concentration of the metal material in the oxygen capturing film increases with distance from an interface between the oxygen capturing film and the separation film,
   wherein the oxygen capturing film is spaced apart from a top surface of the gate insulating film by a distance of about 70 Å to about 80 Å.

2. The semiconductor device of claim 1, further comprising an interlayer insulating film on the semiconductor substrate and comprising a gate hole that defines the gate structure,
   wherein the semiconductor device comprises:
      an adhesive film on the oxygen capturing film; and
      a gap-fill film on the adhesive film, wherein the gap-fill film fills a remaining space of the gate hole in which the gate insulating film, the work function adjusting film, the separation film, the oxygen capturing film, and the adhesive film are formed.

3. The semiconductor device of claim 2, wherein the work function adjusting film comprises a TiN film and a TiAlC film that are sequentially stacked,
   the separation film comprises a TiN film,
   the oxygen capturing film comprises a TiAlC film,
   the adhesive film comprises a TiN film, and
   the gap-fill film comprises tungsten (W) or aluminum (Al).

4. The semiconductor device of claim 2, further comprising a second gate structure on the active region, wherein the interlayer insulating film further comprises a second gate hole that defines the second gate structure,
   wherein the second gate structure comprises:
      a second gate insulating film;
      a second work function adjusting film on the second gate insulating film;
      a second adhesive film directly contacting a top surface of the second work function adjusting film; and
      a second gap-fill film directly contacting a top surface of the second adhesive film, wherein the second gap-fill film fills a remaining space of the second gate hole in which the second gate insulating film, the second work function adjusting film, and the second adhesive film are formed.

5. The semiconductor device of claim 4, wherein an oxygen concentration in the work function adjusting film is less than an oxygen concentration in the second work function adjusting film.

6. The semiconductor device of claim 4, wherein the gate structure is a gate structure of an n-type transistor and the second gate structure is a gate structure of a p-type transistor.

7. The semiconductor device of claim 1, further comprising a gap-fill film on the oxygen capturing film,
   wherein a resistivity of a material of the oxygen capturing film is higher than a resistivity of a material of the gap-fill film.

8. The semiconductor device of claim 1, wherein a thickness of the oxygen capturing film is less than a thickness of the work function adjusting film.

9. A semiconductor device comprising:
   a semiconductor substrate comprising an active region;
   a gate structure on the active region; and
   an interlayer insulating film on the semiconductor substrate and comprising a first gate hole that defines the gate structure,
   wherein the gate structure comprises:
      a gate insulating film;
      a work function adjusting film directly contacting a top surface of the gate insulating film;
      a separation film directly contacting a top surface of the work function adjusting film;
      an oxygen capturing film directly contacting a top surface of the separation film and configured to capture oxygen introduced from outside the gate structure, wherein the oxygen capturing film comprises a metal material and a non-metal material, and wherein a concentration of the metal material in the oxygen capturing film increases with distance from an interface between the oxygen capturing film and the separation film; and
      an adhesive film directly contacting a top surface of the oxygen capturing film.

10. The semiconductor device of claim 9, further comprising a second gate structure on the active region,
    wherein the interlayer insulating film further comprises a second gate hole that defines the second gate structure,
    wherein the second gate structure comprises:
       a second gate insulating film;
       a second work function adjusting film directly contacting a top surface of the second gate insulating film; and
       a second adhesive film directly contacting a top surface of the second work function adjusting film,
       wherein the gate structure is an n-type gate structure and the second gate structure is a p-type gate structure.

11. The semiconductor device of claim 10, wherein the gate structure further comprises a gap-fill film directly contacting a top surface of the adhesive film and filling a remaining space of the first gate hole in which the gate insulating film, the work function adjusting film, the separation film, the oxygen capturing film, and the adhesive film are formed, and
    the second gate structure further comprises a second gap-fill film directly contacting a top surface of the second adhesive film and filling a remaining space of the second gate hole in which the second gate insulating film, the second work function adjusting film, and the second adhesive film are formed.

12. The semiconductor device of claim 10, wherein an oxygen concentration in the work function adjusting film is less than an oxygen concentration in the second work function adjusting film.

13. The semiconductor device of claim 9, wherein the oxygen capturing film is spaced apart from the top surface of the gate insulating film by a distance of about 70 Å to about 80 Å.

14. The semiconductor device of claim 9, wherein the work function adjusting film comprises a TiN film and a TiAlC film that are sequentially stacked, the separation film comprises a TiN film, the oxygen capturing film comprises a TiAlC film, the adhesive film comprises a TiN film, and the adhesive film comprises a tungsten (W) film or an aluminum (Al) film.

15. A semiconductor device comprising:
a semiconductor substrate comprising an active region; and
a gate structure on the active region,
wherein the gate structure comprises:
a gate insulating film;
a work function adjusting film on the gate insulating film;
a separation film on the work function adjusting film; and
an oxygen capturing film on the separation film and configured to capture oxygen introduced from outside the gate structure,
wherein the oxygen capturing film is spaced apart from a top surface of the gate insulating film by a distance of about 70 Å to about 80 Å and a thickness of the oxygen capturing film is less than a thickness of the work function adjusting film, wherein the oxygen capturing film comprises a metal material and a non-metal material, and
wherein the work function adjusting film comprises a TiN film and a TiAlC film that are sequentially stacked, and the separation film comprises a TiN film, the oxygen capturing film comprises a TiAlC film, the adhesive film comprises a TiN film, and the gap-fill film comprises tungsten (W) or aluminum (Al).

* * * * *